(12) United States Patent
Nishikawa

(10) Patent No.: US 12,196,853 B2
(45) Date of Patent: Jan. 14, 2025

(54) PHASE CORRECTING DEVICE AND DISTANCE MEASURING DEVICE

(71) Applicants: Kabushiki Kaisha Toshiba, Tokyo (JP); Toshiba Electronic Devices & Storage Corporation, Tokyo (JP)

(72) Inventor: Masaki Nishikawa, Yokohama Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 980 days.

(21) Appl. No.: 17/198,636

(22) Filed: Mar. 11, 2021

(65) Prior Publication Data

US 2022/0091263 A1    Mar. 24, 2022

(30) Foreign Application Priority Data

Sep. 24, 2020    (JP) .................................. 2020-159785

(51) Int. Cl.
| | |
|---|---|
| *G01S 17/26* | (2020.01) |
| *G01S 7/4915* | (2020.01) |
| *G01S 17/32* | (2020.01) |
| *G01S 17/42* | (2006.01) |
| *H03L 7/14* | (2006.01) |

(52) U.S. Cl.
CPC ............ *G01S 17/26* (2020.01); *G01S 7/4915* (2013.01); *G01S 17/32* (2013.01); *G01S 17/42* (2013.01); *H03L 7/146* (2013.01)

(58) Field of Classification Search
CPC ........ G01S 7/4915; G01S 17/26; G01S 13/84; G01S 17/32; G01S 17/42; H03L 7/146
See application file for complete search history.

(56) References Cited

U.S. PATENT DOCUMENTS

| | | | |
|---|---|---|---|
| 11,184,010 B1* | 11/2021 | Chen | ..................... H03L 7/0807 |
| 2018/0183447 A1* | 6/2018 | Sim | ....................... H03L 7/0992 |
| 2018/0267154 A1 | 9/2018 | Ootaka et al. | |
| 2019/0227141 A1* | 7/2019 | Nishikawa | ......... G07C 9/00309 |

FOREIGN PATENT DOCUMENTS

JP    2018-155724 A    10/2018

* cited by examiner

*Primary Examiner* — Quan Tra
(74) *Attorney, Agent, or Firm* — Kim & Stewart LLP

(57) ABSTRACT

A phase correcting device of an embodiment includes a local oscillator that includes an all digital phase-locked loop configured to generate a plurality of kinds of local oscillation signals based on a reference clock, and is configured to give one of the local oscillation signals to a device configured to detect a phase of an inputted signal, a phase detector configured to acquire and output, at a predetermined timing, an output of a phase integrator included in the all digital phase-locked loop, and a phase calculator configured to acquire, a plurality of times at predetermined timings, values outputted from the phase detector and correct the phase of the inputted signal by using a difference between the values.

6 Claims, 13 Drawing Sheets

PHASE CORRECTING DEVICE AND DISTANCE MEASURING DEVICE

CROSS REFERENCE TO RELATED APPLICATION

This application is based upon and claims the benefit of priority from the prior Japanese Patent Application No. 2020-159785 filed in Japan on Sep. 24, 2020; the entire contents of which are incorporated herein by reference.

FIELD

An embodiment described herein relates generally to a phase correcting device and a distance measuring device.

BACKGROUND

In recent years, keyless entry systems that make it easy to lock and unlock cars have been adopted by many automobiles. According to the technique, a user of an automobile can lock and unlock doors by using communication between a key fob of the automobile and the automobile. Further, in recent years, a smart key system that allows a user to lock and unlock a door or start an engine without touching a key fob has also been widely used.

However, there have been many cases where an attacker who carries out a so-called relay attack invades the communication between a key fob and an automobile, and steals a vehicle or articles in the vehicle. Therefore, as a defense measure against the aforementioned attack (so-called relay attack), a measure for measuring the distance between the key fob and the automobile, and prohibiting the control of the vehicle by communication when the distance is determined to be a predetermined distance or more is being studied.

There are a time detection method, a frequency difference detection method, a phase detection method and the like, as distance measurement methods, but due to the ease of implementation, a distance measurement system which employs a communication type phase detection method that obtains the distance between respective devices by communication between the respective devices has been receiving attention. However, since reference signals between the respective devices independently operate, reference time phases differ from each other, and therefore distance measurement accuracy is generally greatly deteriorated in the communication type phase detection method, which has been a problem.

Note that in the proposal, accurate distance measurement is enabled on the precondition that the phase at a reference time (in particular, the phase at time 0 is called an initial phase), which is hereinafter referred to as a reference time phase, does not fluctuate in a local oscillator in a distance measuring device.

Since the distance measuring device is also mounted on a key fob side, there is a demand for extending the battery life of the key fob, and low power consumption of the distance measuring device is required. Since most of the power consumption of the distance measuring device is consumed by wireless units, reduction in power consumption of the wireless units is required. The power consumption of the wireless units strongly depends on the architecture of the wireless units. A configuration using a digitally controlled oscillator (DCO) direct modulation method (hereinafter also referred to as a DCO direct modulation method) for a transmission unit, and a sliding IF method for a reception unit is widely known as a configuration of low power consumption. Therefore, it is desired to realize a distance measuring device by the configuration using a DCO direct modulation method for the transmission unit, and using a sliding IF method for the reception unit.

However, when distance measurement is performed by using a DCO direct modulation method for the transmission unit, and using a sliding IF method for the reception unit, the reference time phase fluctuates in the local oscillator in the distance measuring device. Therefore, accurate distance measurement cannot be performed with the distance measuring device using a DCO direct modulation method for the transmission unit, and using a sliding IF method for the reception unit.

Note that the fluctuation of the reference time phase in the local oscillator may have an adverse effect on not only the distance measuring device but also various devices that detect the phases of the signals inputted by using the local oscillator.

DETAILED DESCRIPTION

A phase correction device of an embodiment includes a local oscillator that includes an all digital phase-locked loop configured to generate a plurality of kinds of local oscillation signals based on a reference clock, and is configured to give one of the local oscillation signals to a device configured to detect a phase of an inputted signal, a phase detector configured to acquire and output, at a predetermined timing, an output of a phase integrator included in the all digital phase-locked loop, and a phase calculator configured to acquire, a plurality of times at predetermined timings, values outputted from the phase detector and correct the phase of the inputted signal by using a difference between the values.

Hereinafter the embodiment of the present invention will be described with reference to the drawings.

Embodiment

Figure 1:
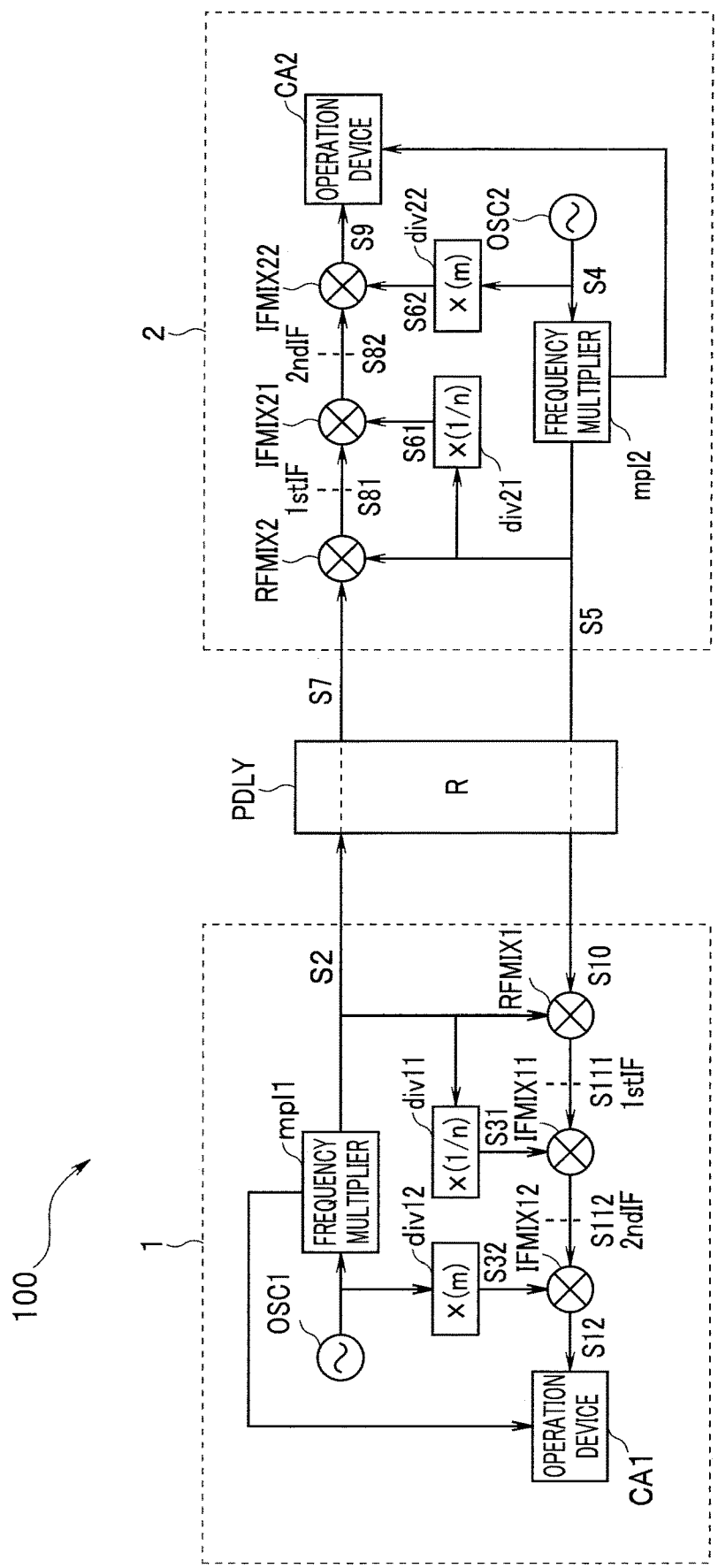
FIG. 1 is a block diagram illustrating a distance measuring system configured by distance measuring devices each including a phase fluctuation detecting device and a phase correcting device according to an embodiment.

FIG. 1 is a block diagram illustrating a distance measuring system configured by distance measuring devices each including a phase fluctuation detecting device and a phase correcting device according to the embodiment. Distance measurement obtaining a distance between a device 1 and a device 2 is enabled by performing transmission and reception of a single wave signal between the devices 1 and 2 in FIG. 1. Note that the single wave signal is a signal of a single frequency such as an unmodulated carrier.

In the present embodiment, an example in which the phase fluctuation detecting device and the phase correcting device are applied to the distance measuring device is explained, but it is also possible to apply the phase fluctuation detecting device and the phase correcting device to various devices that detect phases of inputted signals other than the distance measuring device. For example, application to a positioning device is also possible.

Figure 2:
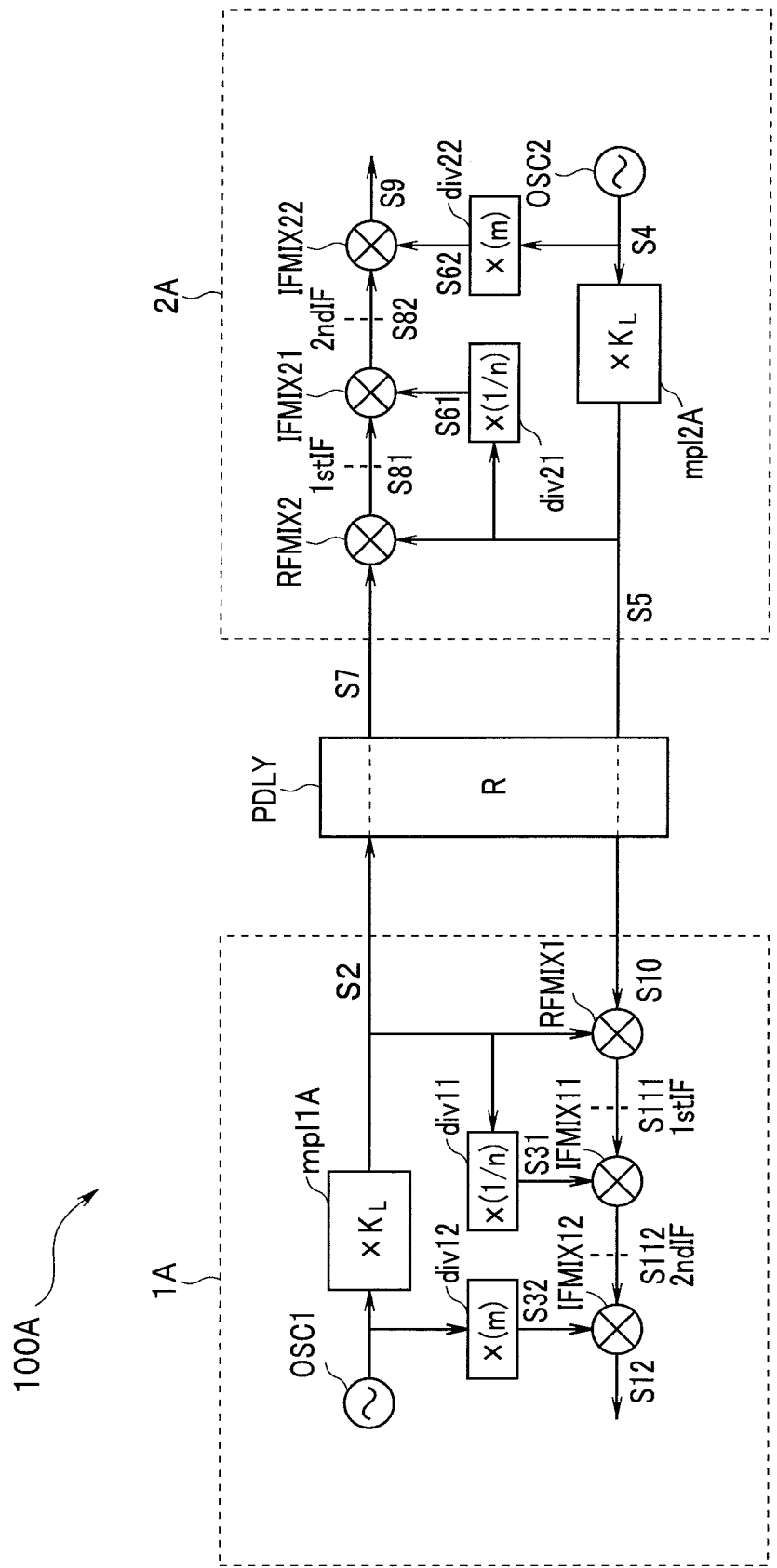
FIG. 2 is a configurational diagram of a wireless circuit of a distance measuring system in a related art that carries out distance measurement between two devices by a communication type phase detection method.

FIG. 2 is a configurational diagram of a wireless circuit of a distance measuring system in a related art that performs distance measurement between two devices by a communication type phase detection method. In FIG. 1 and FIG. 2, same components are assigned with same reference signs, and redundant explanation will be omitted for the same components.

In the communication type phase detection method, distance measurement is performed by transmitting phase information detected by one of the devices to the other device. In this manner, highly accurate distance calculation can be achieved in some cases by performing a predetermined operation using phase information of signals detected by reception units of two distance measuring devices in a pair, but it is difficult to achieve accurate distance measurement when the reception units are of a sliding IF method.

First, with reference to FIG. 2, a reason why accurate measurement cannot be performed even when phase information of signals detected by reception units of two distance measuring devices that form a pair is used with distance measuring devices each of a related art using a digitally controlled oscillator (DCO) direct modulation method for a transmission unit, and using a sliding IF method for a reception unit will be described. Further, FIG. 3 to FIG. 6 are diagrams for explaining operations in the devices in FIG. 2.

A distance measuring system 100A includes a device 1A and a device 2A. At least one of the device 1A and the device 2A is movable. In the distance measuring system 100A, a distance between the device 1A and the device 2A is calculated based on carrier phase detection. A case where one of the device 1A and the device 2A calculates the distance based on phase information acquired by the device 1A and the device 2A will be considered.

The device 1A transmits a first distance measurement signal (single wave signal), and the device 2A transmits a second distance measurement signal (single wave signal). The first and the second distance measurement signals reach the device 2A and the device 1A respectively via a propagation path PDLY between the device 1A and the device 2A. The device 1A and the device 2A each include a wireless circuit using a DCO direct modulation method of low power consumption for a transmission unit, and using a sliding IF method of low power consumption for a reception unit.

FIG. 2 illustrates a configuration of simplified wireless units of the device 1A and the device 2A. The device 1A includes an oscillator (OSC1) peculiar to the device, a frequency multiplier (mpl1A), an RF frequency converter (RFMIX1), a first frequency divider (div11), a second frequency divider (div12), a first intermediate (1stIF) frequency converter (IFMIX11), and a second intermediate (2ndIF) frequency converter (IFMIX12). The device 2A also includes a wireless architecture similar to the device 1A, and includes an oscillator (OSC2) peculiar to the device, a frequency multiplier (mpl2A), an RF frequency converter (RFMIX2), a first frequency divider (div21), a second frequency divider (div22), a first intermediate (1stIF) frequency converter (IFMIX21), and a second intermediate (2ndIF) frequency converter (IFMIX22). Note that in the devices 1A and 2A, output signals of mpl1A and mpl2A become transmission signals of the devices 1A and 2A, and are also used as local signals (LO signals). In other words, mpl1A and mpl2A respectively configure local oscillators.

Hereinafter, in order to clarify a problem, the device 1A and the device 2A are assumed to set transmission frequencies first of all. In other words, in an initial setting, for example, the transmission frequencies of the devices 1A and 2A are respectively set at frequencies obtained by multiplying the oscillation frequencies of OSC1 and OSC2 by a predetermined multiple $k_L$.

An output signal (oscillation signal) S1 ($=lo_{x1}$) of OSC1 of the device 1A can be expressed by equation (1) with a frequency of an oscillation signal of OSC1 set as $f_{x1}$ and a phase (hereinafter simply referred to as a reference time phase when it is clear that the phase is at a reference time in the device 1A or description is made on the device 1A) at a time $t_{a1}$ as a reference in operation of the device 1A set as $\theta_{x1}$.

$$lo_{x1} = \sin(2\pi f_{x1}(t-t_{a1}) + \theta_{x1}) \quad (1)$$

The oscillation frequency of OSC1 is multiplied by $k_L$ by mpl1A. When a reference time phase of an output signal S2 of mpl1A is set as $\theta_{Lx1}$, a phase $\phi_{tx1}$ of the output signal S2 of mpl1A is expressed as follows.

$$\phi_{tx1} = 2\pi k_L f_{x1}(t-t_{a1}) + \theta_{Lx1} \quad (2)$$

An output of mpl1A is generally generated by a digitally controlled oscillator (DCO) technique and a digital frequency/phase synchronization technique. Note that in mpl1A using a TDC (time to digital converter) for a phase synchronizing unit, $\theta_{Lx1} = k_L \theta_{x1}$ is not generally established. Therefore, in equation (2) described above, the reference time phase of the output S2 of mpl1A is defined as $\theta_{Lx1}$.

For the device 2A, a similar transmission frequency setting is performed. An output signal S4 ($=lo_{x2}$) of OSC2 of the device 2A can be expressed by equation (3) with a frequency of an oscillation signal of OSC2 set as $f_{x2}$ and a phase (hereinafter simply referred to as a reference time phase when it is clear that the phase is at a reference time in the device 2A or description is made on the device 2A) at a time $t_{a2}$ as a reference in operation of the device 2A set as $\theta_{x2}$.

$$lo_{x2} = \sin(2\pi f_{x2}(t-t_{a2}) + \theta_{x2}) \quad (3)$$

In mpl2A, the oscillation frequency of OSC2 is multiplied by $k_L$. A phase $\phi_{tx2}$ of an output signal S5 of mpl2A is expressed as follows.

$$\phi_{tx2} = 2\pi k_L f_{x2}(t - t_{a2}) + \theta_{Lx2} \quad (4)$$

Here, $\theta_{Lx2}$ is a reference time phase of the output of mpl2A. For the output of mpl2A, $\theta_{Lx2} = k_L \theta_{x2}$ is not generally established as in the output of mpl1A. Therefore, in equation (4) described above, the reference time phase of the output of mpl2A is defined as $\theta_{Lx2}$.

Patent Literature 1 discloses that in the case of a system of TDD (time division duplex) that does not simultaneously carry out transmission and reception, correct distance measurement can be performed by performing exchange of single wave signals between the device 1A and the device 2A. Note that the devices in Patent Literature 1 differ from the devices in FIG. 2 in configuration of the wireless units. Patent Literature 1 shows that distance measurement can be correctly performed by adopting a distance measurement sequence of "8 alternations" that repeats transmission and reception of four times each in total between the devices 1A and 2A by each using two single-wave signals. Transmitting and receiving while changing the frequency like this is enabled by changing settings of mpl1A and mpl2A in the devices 1A and 2A.

Figure 3:
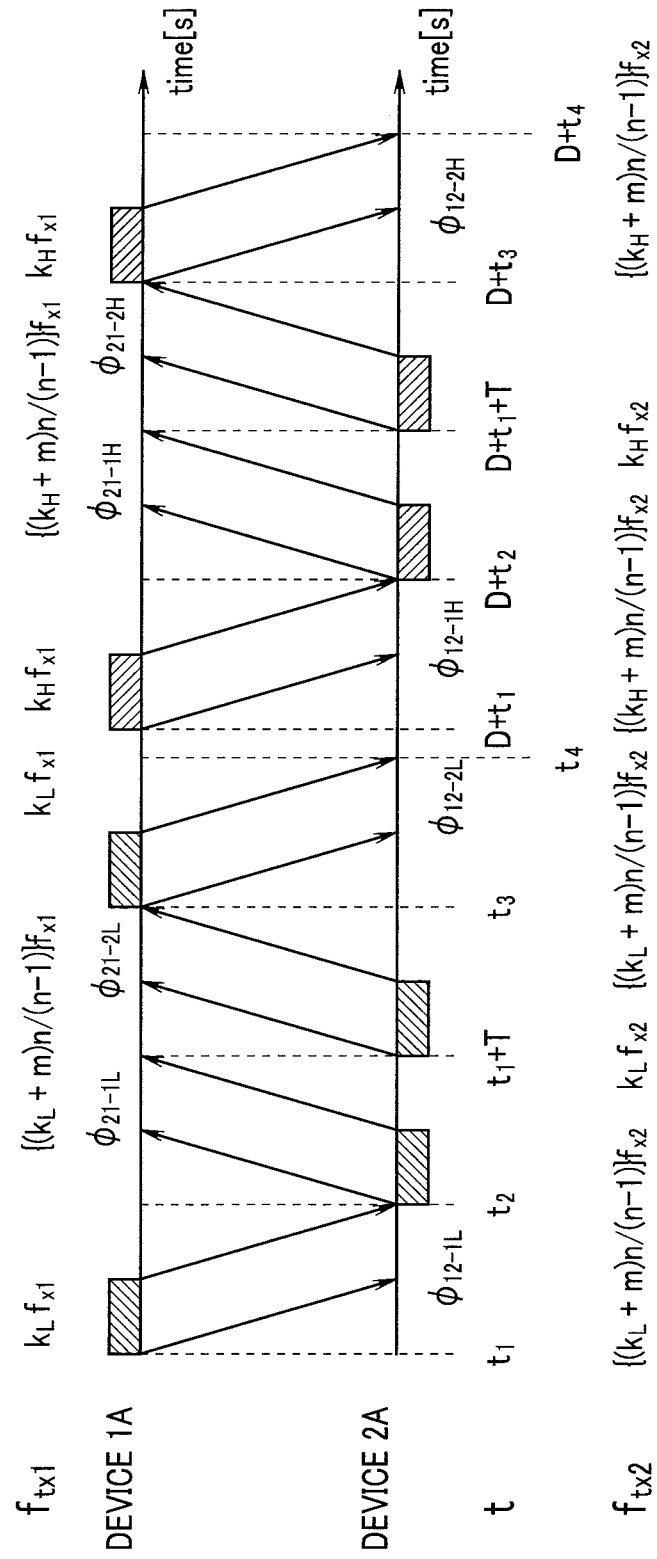
FIG. 3 is an explanatory diagram illustrating an "8 alternations" distance measuring sequence in a case where the distance measuring devices each using a DCO direct modulation method for a transmission unit, and a sliding IF method for a reception unit.

FIG. 3 illustrates an example of an "8 alternations" distance measurement sequence in a case where the distance measuring devices each using a DCO direct modulation method for the transmission unit, and a sliding IF method for the reception unit are employed. Explaining an order of alternations by paying attention to transmission signals regarding the distance measurement sequence in FIG. 3, the order is as follows. The device 1A transmits signals of a frequency $K_L f_{x1}$ at times $t=t_1$, and $t=t_3$, and transmits signals of frequency $k_H f_{x1}$ at times $D+t_1$, and $D+t_3$. The device 2A transmits a signal of a frequency $K_L f_{x2}$ twice from a time $t_2$, and transmits a signal of frequency $k_H f_{x2}$ twice from a time $D+t_2$.

The device 1A and the device 2A perform transmission after the frequencies of the transmission signals are respectively set at $k_L f_{x1}$ and the frequency of $k_L f_{x2}$ (hereinafter these frequencies are also referred to as low frequencies) in the initial setting. When only transmission of the devices 1A and 2A is considered, a single wave signal of the frequency $k_L f_{x1}$ is transmitted from the device 1A to the device 2A first, and the device 2A receives the single wave signal of the frequency $k_L f_{x1}$ from the device 1A. FIG. 3 shows that transmission is performed at the time $t_1$ after it takes a predetermined time period for the device 1A to be set to transmit the single wave signal of the frequency $k_L f_{x1}$ to the device 2A.

Next, after it takes a predetermined time period for the device 2A to be set to transmit the single wave signal of the frequency $k_L f_{x2}$ to the device 1A, transmission of the single wave signal is performed twice at the time $t_2$. Furthermore, a single wave signal of the frequency $k_L f_{x1}$ is transmitted from the device 1A to the device 2A again, and the device 2A receives the single wave signal of the frequency $k_L f_{x1}$ from the device 1A. The device 1 takes a predetermined time period for the transmission, and performs transmission at the time $t_3$. The signal exchanges end at a time $t_4$.

Figure 4:
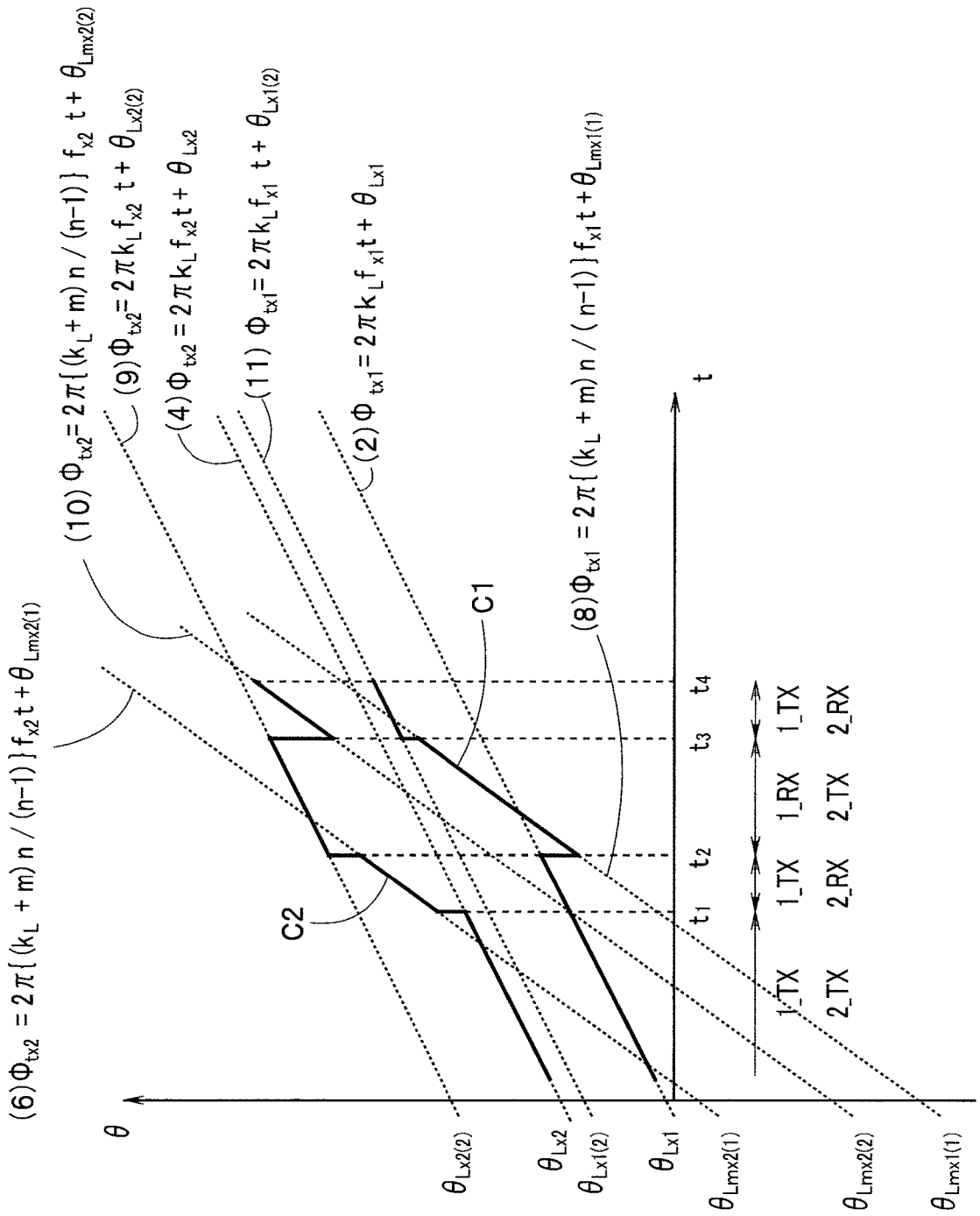
FIG. 4 is a graph illustrating changes of phases of signals S2 and S5 in the "8 alternations" distance measuring sequence, by plotting a time in a horizontal axis, and plotting a phase θ in a vertical axis.

FIG. 4 is a graph illustrating changes in phases of the signals S2 and S5 in the "8 alternations" distance measurement sequence, with a time plotted in a horizontal axis and a phase $\theta$ plotted in a vertical axis. In FIG. 4, a case of $t_{a1}=t_{a2}$ is illustrated for easy understanding of phase change, and a time at an intersection point of a vertical axis and a horizontal axis is illustrated as the time $t_{a1}$ or the time $t_{a2}$. Note that numbers shown in parentheses in FIG. 4 correspond to numbers of equations in the description. In the phases at a time shown in the vertical axis in FIG. 4, L included in subscripts indicates that the single wave signal has a low frequency, x1 indicates the reference time phase of the signal S2, x2 indicates the reference time phase of the signal S5, m indicates a case of multiplying the frequency by $(k_L+m)n/(n-1)$, and numbers in subscript parentheses of the phases $\theta$ in FIG. 4 correspond to orders of a change in frequency from the frequency of the initial setting without parentheses. Meanings of n and m will be described later. In the description, the same subscripts will be used hereinafter, and H of a subscript in each of signs indicating the reference time phases of the signals S2 and S5 indicates that the single wave signal has a high frequency.

A dashed straight line (2) in FIG. 4 represents a phase $\theta_{tx1}$ of the output signal S2 of mpl1A of the device 1A, and a dashed straight line (4) represents a phase $\phi_{tx2}$ of the output signal S5 of a mpl2A of the device 2A. The phase $\phi_{tx1}$ has a linear characteristic having an inclination of $2\pi K_L f_{x1}$ with the reference time phase as $\theta_{Lx1}$. The phase $\phi_{tx2}$ has a linear characteristic having an inclination of $2\pi K_L f_{x2}$ with the phase at time $t_a$ as $\theta_{Lx2}$.

However, in the distance measuring device in FIG. 2 using a DCO direct modulation method and a sliding IF method, it is necessary to change the frequencies of the transmission signals of mpl1A and mpl2A at a transmission time and a reception time.

Figure 5:
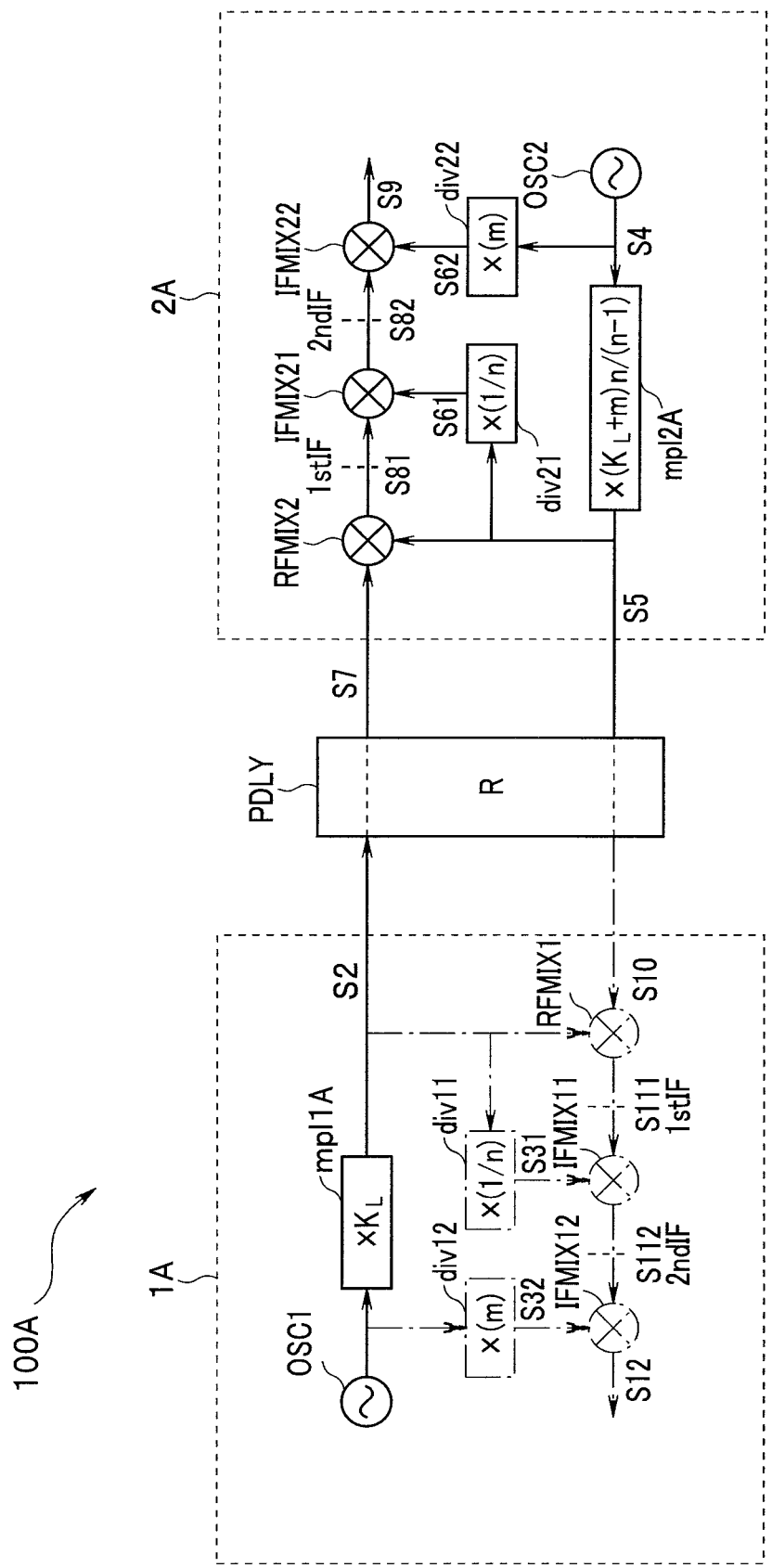
FIG. 5 is an explanatory diagram illustrating settings of a device 1A and a device 2A between a time $t_1$ and a time $t_2$ of FIG. 3.

FIG. 5 is an explanatory diagram illustrating settings of the device 1A and the device 2A between the time $t_1$ and the time $t_2$ in FIG. 3. Note that in a period between the times $t_1$ and $t_2$, a reception operation of the device 1A is not performed, and therefore unnecessary units for operation are shown by dash-dotted lines.

In the sliding IF method, a reception signal is converted into a 1stIF frequency and then converted into a 2ndIF frequency. In an example of FIG. 5, RFMIX2 of the device 2A needs convert a reception signal into a 1stIF frequency signal S81 of approximately $-\{(k_L+mn)/(n-1)\}f_{x2}$ first. For this reason, in the device 2A that receives a single wave signal of the frequency $k_L f_{x1}$ from the device 1A, a frequency of the local signal (LO signal) S5 from mpl2A which is given to RFMIX2 is set at $\{(k_L+m)n/(n-1)\}f_{x2}$ instead of $k_L f_{x2}$. The reception signal that is converted into the 1stIF frequency signal S81 has frequency-converted by the first IF frequency convertor (IFMIX21), and a 2ndIF frequency signal S82 is obtained. An LO signal S5 is frequency-divided to a signal S61 having a frequency obtained by multiplying the LO signal S5 by (1/n) by div21, and the signal S61 is used as an LO signal for IFMIX21. The reception signal that is converted into the 2ndIF frequency is frequency-converted by the second IF frequency convertor (IFMIX22), and an output signal S9 of a base band is obtained. An output signal S4 of OSC2 is frequency-divided to a signal S62 having a frequency obtained by multiplying the output signal S4 by m by div22, and the signal S62 is used as an LO signal for IFMIX22. A phase $\phi_{b2}$ of the signal S62 is expressed by equation (5) as follows.

$$\phi_{b2} = 2\pi m f_{x2}(t - t_{a2}) + \theta_{Bx2} \quad (5)$$

Here, $\theta_{Bx2}$ is a reference time phase of the LO signal for IFMIX22 from div 22.

In order to receive a signal from the device 1A in the device 2A, the phase $\phi_{tx2}$ of the output signal S5 of mpl2A is set at what is shown by equation (6) as follows that is obtained by transforming equation (4) described above.

$$\theta_{tx2}=2\pi\{(k_L+m)n/(n-1)\}f_{x2}(t-t_{a2})+\theta_{Lmx2(1)} \quad (6)$$

Here, $\theta_{Lmx2(1)}$ is a reference time phase of the output signal S5 of mpl2A between the time $t_1$ and the time $t_2$. In this case, a phase $\phi_{v2}$ of the signal S61 is expressed by equation (6a).

$$\phi_{v2}=2\pi\{(k_L+m)/(n-1)\}f_{x2}(t-t_{a2})+\theta_{LVx2(1)} \quad (6a)$$

Here, $\theta_{Lvx2(1)}$ is a reference time phase of the signal S61 between the time $t_1$ and the time $t_2$. Note that it is not necessary to change the frequency of mpl1A in the device 1A, and therefore the phase $\theta_{tx1}$ of the output signal S2 of mpl1A remains as in equation (2).

Figure 6:
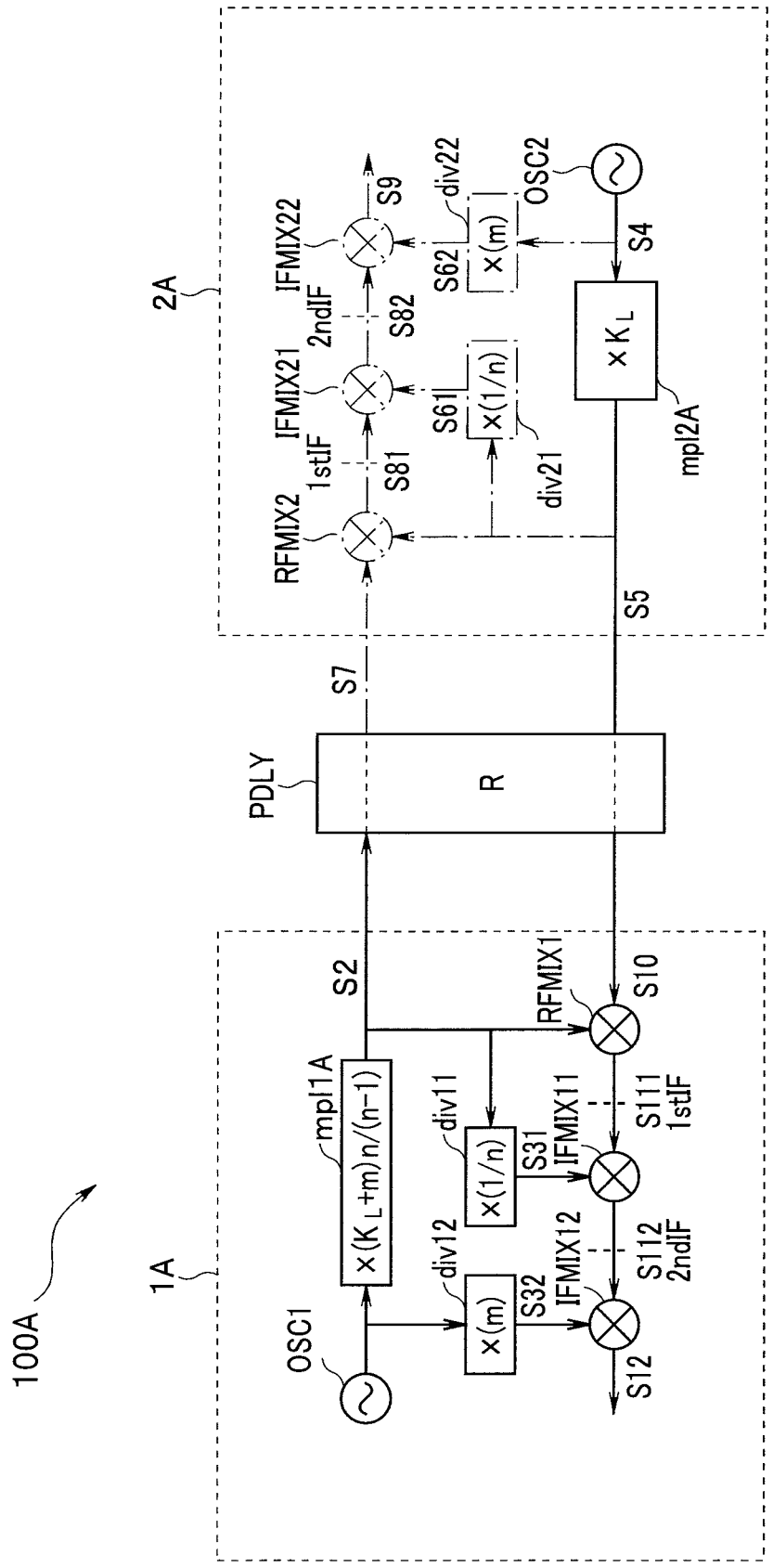
FIG. 6 is a diagram for explaining operations in the devices of FIG. 2.

FIG. 6 is an explanatory diagram illustrating settings of the device 1A and the device 2A between the time $t_2$ and the time $t_3$ in FIG. 3. Note that in a period between the time $t_2$ and the time $t_3$, a reception operation of the device 2A is not performed, and therefore unnecessary units for operation are shown by dash-dotted lines.

In the device 1A that adopts a sliding IF method, RFMIX1 needs to convert a reception signal into an IF frequency signal S111 of approximately $-\{(k_L+mn)/(n-1)\}f_{x1}$ first. For this reason, in the device 1A that receives a single wave signal of the frequency $k_Lf_{x2}$ from the device 2A, the frequency of the local signal (LO signal) S2 from mpl1A which is given to RFMIX1 is set at $\{(k_L+m)n/(n-1)\}fx_1$ instead of $k_Lf_{x1}$. The reception signal that is converted into the 1stIF frequency signal S111 has frequency-converted by the first IF frequency convertor (IFMIX11), and a 2ndIF frequency signal S112 is obtained. A LO signal S2 is frequency-divided to a signal S31 having a frequency obtained by multiplying the LO signal S2 by (1/n) by div11, and the signal S31 is used as an LO signal for IFMIX11. The reception signal that is converted into the 2ndIF frequency is frequency-converted by the second IF frequency convertor (IFMIX12), and an output signal S12 of a base band is obtained. An output signal S1 of OSC1 is frequency-divided to a signal S32 having a frequency obtained by multiplying an output signal S1 of OSC1 by m by div12, and the signal S32 is used as an LO signal for IFMIX1. A phase $\phi_{b1}$ of the signal S32 is expressed by equation (7) as follows.

$$\phi_{b1}=m2\pi f_{x1}(t-t_{a2})+\theta_{Bx1} \quad (7)$$

Here, $\theta_{Bx1}$ is a reference time phase of the LO signal for IFMIX12 from div12.

In order to receive a signal from the device 2A, in the device 1A, the phase $\phi_{tx1}$ of the output signal S2 of mpl1A is set at what is shown by equation (8) as follows that is obtained by transforming equation (2) described above.

$$\phi_{tx1}=2\pi\{(k_L+m)n/(n-1)\}f_{x1}(t-t_{a1})+\theta_{Lmx1(1)} \quad (8)$$

Here, $\theta_{Lmx1(1)}$ is a reference time phase of the output signal S2 of mpl1A between the time $t_2$ and the time $t_3$. In this case, a phase $\phi_{v1}$ of the signal S31 is expressed by equation (8a) as follows.

$$\phi_{v1}=2\phi\{(k_L+m)/(n-1)\}f_{x1}(t-t_{a1})+\theta_{LVx1(1)} \quad (8a)$$

Here, $\theta_{Lvx1(1)}$ is a reference time phase of the signal S31 between the time $t_2$ and the time $t_3$.

The device 2A returns the setting of the transmission frequency from $\{(k_L+m)n/(n-1)\}f_{x2}$ to $k_Lf_{x2}$ in a period between the time $t_2$ and the time $t_3$. At this time, the phase $\phi_{x2}$ of the output signal S5 of mpl2A is expressed by equation (9) as follows. Note that $\theta_{Lx2(2)}$ is a reference time phase of the signal S5 in this case.

$$\phi_{tx2}=2\pi k_Lf_{x2}(t-t_{a2})+\theta_{Lx2(2)} \quad (9)$$

Settings of the device 1A and the device 2A are same as the settings in FIG. 5, between the time $t_3$ and the time $t_4$ that are in a next sequence. In the device 2A, in order to receive a single wave signal of the frequency $k_Lf_{x1}$ from the device 1A, the frequency of the LO signal (signal S5) given to RFMIX2 is changed from $k_Lf_{x2}$ to $\{(k_L+m)n/(n-1)\}f_{x2}$. Note that in this case, the phase $\phi_{b2}$ of the LO signal (signal S6) for IFMIX2 given to IFMIX2 is the same as in equation (5) described above.

The phase $\phi_{tx2}$ of the output signal S5 of mpl2A of the device 2A is given by equation (10) as follows obtained by transforming equation (9) described above.

$$\phi_{tx2}=2\pi\{(k_L+m)n/(n-1)\}f_{x2}(t-t_{a2})+\theta_{Lmx2(2)} \quad (10)$$

Here, $\theta_{Lmx2(2)}$ is the reference time phase of the output signal S5 of mpl2A between the time $t_3$ and the time $t_4$. In this case, a phase $\phi_{v2}$ of the signal S61 is expressed by equation (10a) as follows.

$$\phi_{v2}=2\pi\{(k_L+m)/(n-1)\}f_{x2}(t-t_{a2})+\theta_{LVx2(2)} \quad (10a)$$

Here, $\theta_{LVx2(2)}$ is a reference time phase of the signal S61 between the time $t_3$ and the time $t_4$.

The device 1A returns the transmission frequency from $\{(k_L+m)n/(n-1)\}f_{x1}$ to $K_Lf_{x1}$. At this time, the phase $\phi_{tx1}$ of the output signal S2 of mpl1A is set at what is shown by equation (11) as follows.

$$\theta_{tx1}=2\pi k_Lf_{x1}(t-t_{a1})+\theta_{Lx1(2)} \quad (11)$$

Here, $\theta_{Lx1(2)}$ is the reference time phase of the output signal S2 of mpl1A between the time $t_3$ and the time $t_4$.

In this way, between the time $t_1$ and the time $t_4$, the phase $\phi_{tx1}$ of the signal S2 of mpl1A changes as shown by a thick line characteristic C1 in FIG. 4, and the phase $\phi_{tx2}$ of the signal S5 of mpl2A changes as shown by a thick line characteristic C2 in FIG. 4.

From a time $D+t_1$ to a time $D+t_4$ in FIG. 3, a single wave signal of the frequency of $k_Hf_{x1}$ is transmitted from the device 1A, and a single wave signal of the frequency of $k_Hf_{x2}$ is outputted from the device 2A. Hereinafter these frequencies are also referred to as high frequencies. A sequence in this case only differs from the above sequence in that $k_L$ is changed to $k_H$ in FIG. 5 and FIG. 6, and therefore explanation will be omitted.

Next, referring to FIG. 5, a phase $\phi_{BB2L(T12)}$ (t) of the base band signal S9 detected in the device 2A between the time $t_1$ and the time $t_2$ is obtained while phases of mpl1A and mpl2A are considered. A phase $\phi_{rx2}$ of a signal S7 after passing through the propagation path PDLY is expressed by equation (12) as follows.

$$\phi_{rx2}=2\pi k_Lf_{x1}(t-t_{a1}-\tau_R)+\theta_{Lx1} \quad (12)$$

Here, $\tau_R$ is a delay time of a propagation path length R. The signal S7 is frequency-converted by using the signal S5 (LO signal). From equation (12) and equation (6), a phase $\theta_{if1x2(T12)}$ (t) of an output signal S81 of RFMIX2 is expressed by equation (13) as follows.

$$\phi_{if1x2(T12)}(t)=2\pi k_Lf_{x1}(t-t_{a1})-2\pi\{(k_L+m)n/(n-1)\}fx2(t-t_{a2})+(\theta_{Lx1}-\theta_{Lmx2(1)})-2\pi k_Lf_{x1}\tau_R \quad (13)$$

Note that equation (13) shows a phase result of extracting only a desired signal. The signal is frequency-converted by using the signal S61. From equation (13) and equation (6a), a phase $\phi_{if2x2(T12)}$ (t) of an output signal S82 of IFMIX21 is expressed by equation (13a) as follows.

$$\phi_{if2x2(T12)}(t)=2\pi k_L(f_{x1}-f_{x2})t-2\pi mf_{x2}t+(\theta_{Lx1}-\theta_{Lmx2(1)}+\theta_{Lvx2(1)})-2\pi k_Lf_{x1}\tau_R-2\pi k_Lf_{x1}t_{a1}+2\pi(k_L+m)f_{x2}t_{a2} \quad (13a)$$

Note that equation (13a) shows a phase result of extracting only a desired signal. The signal is frequency-converted by using the signal S62. Accordingly, from equation (13a)

and equation (5), the phase $\phi_{BB2L(T12)}$ (t) of the signal S9 detected in the device 2A is what is expressed by equation (14) as follows.

$$\Delta_{BB2L(T12)} = 2\pi k_L(f_{x1}-f_{x2})t + (\theta_{Lx1}-\theta_{Lmx2(1)}+\theta_{LVx2(1)}) + \theta_{Bx2} - 2\pi k_L(f_{x1}t_{a1}-f_{x2}t_{a2}) - 2\pi k_L f_{x1}\tau_R \quad (14)$$

Note that equation (14) shows a result of performing desired quadrature demodulation.

Similarly, with reference to FIG. 5, a phase of the signal S9 detected in the device 2A between the time $t_3$ and the time $t_4$ is obtained. From equation (11), the phase of the signal S7 after passing through the propagation path PDLY is expressed as follows.

$$\phi_{rx2} = 2\pi k_L f_{x1}(t-t_{a1}-\tau_R) + \theta_{Lx1(2)} \quad (15)$$

The signal S7 is frequency-converted by the signal S5 (LO signal). From equation (15) and equation (10), a phase $\phi_{if1x2(T34)}$ (t) of an output signal S81 of RMIX2 is expressed by equation (16) as follows.

$$\phi_{if1x2(T34)}(t) = 2\pi k_L f_{x1}(t-t_{a1}) - 2\pi\{(k_L+m)n/(n-1)\}f_{x2}(t-t_{a2}) + (\theta_{Lx1(2)}-\theta_{Lmx2(2)}) - 2\pi k_L f_{x1}\tau_R \quad (16)$$

Note that equation (16) shows a phase result of extracting only a desired signal. The signal is frequency-converted by using the signal S61. From equation (16) and equation (10a), a phase $\phi_{if2x2(T34)}$ (t) of an output signal S82 of IFMIX21 is expressed by equation (16a) as follows.

$$\phi_{if2(T34)}(t) = 2\pi k_L(f_{x1}-f_{x2})t - 2\pi m f_{x2}t + (\theta_{Lx1(2)}-\theta_{Lmx2(2)} + \theta_{LVx2(2)}) - 2\pi k_L f_{x1}\tau_R - 2\pi k_L f_{x1}t_{a1} + 2\pi(k_L+m)f_{x2}t_{a2} \quad (16a)$$

Note that equation (16a) shows a phase result of extracting only a desired signal. The signal is frequency-converted by using the signal S62. From equation (16a) and equation (5), a phase $\phi_{BB2L(T34)}$ (t) of the signal S9 detected in the device 2A is as follows.

$$\phi_{BB2L(T34)}(t) = 2\pi k_L(f_{x1}-f_{x2})t + (\theta_{Lx1(2)}-\theta_{Lmx2(2)}+\theta_{LVx2(2)}) + \theta_{Bx2} - 2\pi k_L(f_{x1}t_{a1}-f_{x2}t_{a2}) - 2\pi k_L f_{x1}\tau_R \quad (17)$$

Note that equation (17) describes a result of performing desired quadrature demodulation.

Next, with reference to FIG. 6, a phase of the signal S12 detected in the device 1A between the time $t_2$ and the time $t_3$ is obtained. A phase $\phi_{rx1}$ of a signal S10 after passing through the propagation path PDLY is given by equation (18) as follows from equation (9) described above.

$$\phi_{rx1} = 2\pi k_L f_{x2}(t-t_{a1}-\tau_R) + \theta_{Lx2(2)} \quad (18)$$

The signal S10 is frequency-converted by using the signal S2 (LO signal) in RFMIX1. From equation (18) and equation (8), a phase $\phi_{if1x1(T23)}$ (t) of an output signal S111 of RFMIX1 is expressed by equation (19) as follows.

$$\phi_{if1x1(T23)}(t) = 2\pi k_L f_{x2}(t-t_{a2}) - 2\pi\{(k_L+m)n/(n-1)\}f_{x1}(t-t_{a1}) + (\theta_{Lx2}-\theta_{Lmx1(1)}) - 2\pi k_L f_{x2}\tau_R \quad (19)$$

Note that equation (19) shows a phase result of extracting only a desired signal. The signal is frequency-converted by using the signal S31. From equation (19) and equation (8a), a phase $\phi_{if2x2(T23)}$ (t) of an output signal S112 of IFMIX11 is expressed by equation (19a) as follows.

$$\phi_{if1(T23)}(t) = 2\pi k_L(f_{x2}-f_{x1})t - 2\pi m f_{x1}t + (\theta_{Lx2(2)}-\theta_{Lmx1(1)} + \theta_{LVx1(1)}) - 2\pi k_L f_{x2}\tau_R + 2\pi(k_L+m)f_{x1}t_{a1} - 2\pi k_L f_{x2}t_{a2} \quad (19a)$$

Note that equation (19a) shows a phase result of extracting only a desired signal. The signal S112 is frequency-converted by using the signal S32. As a result, a phase $\phi_{BB2L(T23)}$ (t) of the signal S12 detected in the device 1A is expressed by equation (20) as follows from equation (19a) and equation (7).

$$\phi_{BB2L(T23)}(t) = 2\pi k_L(f_{x2}-f_{x1})t + (\theta_{Lx2(2)}-\theta_{Lmx1(1)}+\theta_{LVx1(1)}) + \theta_{Bx1} + 2\pi k_L(f_{x1}t_{a1}-f_{x2}t_{a2}) - 2\pi k_L f_{x2}\tau_R \quad (20)$$

Note that equation (20) describes a result that a desired quadrature modulation is performed.

Patent Literature 1 shows that a distance can be obtained by addition of the phases of the reception signals obtained by the distance measurement sequence. In the example of FIG. 3, an addition result $\phi_{BBLSUM}$ (t) of four phases is expressed by equation (21) as follows when the four phases of reception signals obtained in transmission and reception of single wave signals of a low frequency from the time $t_1$ to the time $t_4$ are respectively $\phi_{12-1L}$, $\phi_{21-1L}$, $\phi_{21-2L}$, and $\phi_{12-2L}$.

$$\phi_{BBLSUM}(t) = \phi_{12-1L} + \phi_{21-1L} + \phi_{21-2L} + \phi_{12-2L} \quad (21)$$

When an interval between the time $t_2$ and the time $t_1$ and an interval $t_0$ between the time $t_4$ and the time $t_3$ are defined as $$t_0 = t_2 - t_1 = t_4 - t_3 \quad (22),$$

and a time interval from a time at which a first distance measurement signal is transmitted from the device 1A to a time at which a second distance measurement signal is transmitted from the device 2A is set as T, the four-phase addition result of equation (21) is as shown in equation (23) as follows.

$$\phi_{BBLSUM}(t) = \phi_{BB2L(T12)}(t) + \phi_{BB2L(T23)}(t+t_0) + \phi_{BB2L(T23)}(t+T) + \phi_{BB2L(T34)}(t+t_0+T) \quad (23)$$

Equation (14), equation (17) and equation (20) described above are substituted into equation (23) described above, and thereby equations (24) and (25) as follows are obtained.

$$\phi_{BBLSUM}(t) = -4\pi k_L(f_{x1}+f_{x2})\tau_R + 2(\theta_{Bx1}+\theta_{Bx2}) + \theta_{LSUM} \quad (24)$$

$$\theta_{LSUM} = (\theta_{Lx1}-\theta_{Lmx2(1)}+\theta_{LVx2(1)}) + 2\times(\theta_{Lx2(2)}-\theta_{Lmx1(1)} + \theta_{LVx1(1)}) + (\theta_{Lx1(2)}-\theta_{Lmx2(2)}+\theta_{LVx2(2)}) \quad (25)$$

When a delay $\tau_R$ is obtained from equation (24) described above, the delay $\tau_R$ corresponding to a distance between devices is what is shown by equation (26) as follows.

$$\tau_R = (\theta_{Bx1}+\theta_{Bx2})/\{2\pi k_L(f_{x1}+f_{x2})\} - \theta_{LSUM}/\{4\pi k_L(f_{x1}+f_{x2})\} + \phi_{BBLSUM}(t)/\{4\pi k_L(f_{x1}+f_{x2})\} \quad (26)$$

A third term of equation (26) described above is the addition result of the four phases, and is obtained by measurement. However, the other terms are difficult to detect. Accordingly, correct distance measurement cannot be performed with four alternations of single wave signals of a low frequency.

In the distance measurement sequence in FIG. 3, the devices 1A and 2A carry out a sequence using single wave signals of a high frequency following the low frequency transmission. The high-frequency sequence is similar to the low-frequency sequence, but a difference lies in changing the frequency setting parameter $k_L$ to $k_H$. Important equations for analysis will be shown as follows.

Between a time $D+t_1$ and a time $D+t_2$, the device 2A receives a single wave signal of a frequency $k_H f_{x1}$ from the device 1A. A phase $\phi_{BB2H(T12)}$ (t) of a signal S7 received by the device 2A is expressed by equation (27) as follows.

$$\phi_{BB2H(T12)} = 2\pi k_H(f_{x1}-f_{x2})t + (\theta_{Hx1}-\theta_{Hmx2(1)}+\theta_{HVx2(1)}) + \theta_{Bx2} - 2\pi k_L(f_{x1}t_{a1}-f_{x2}t_{a2}) - 2\pi k_H f_{x1}\tau_R \quad (27)$$

Note that $\theta_{Hx1}$ is a reference time phase of the signal S2 of the frequency $k_H f_{x1}$ of the device 1A, and $\theta_{Hmx2(1)}$ is a reference time phase of the signal S5 of a frequency $\{(k_H+m)n/(n-1)\}f_{x2}$ of the device 2A, and $\theta_{HVx2(1)}$ is a reference time phase of the signal S61 at this time.

Between a time $D+t_2$ and a time $D+t_3$, the device 1A receives a single wave signal of a frequency $k_H f_{x2}$ from the device 2A. A phase $\phi_{BB2H(T23)}(t)$ of the signal S12 received by the device 1A is expressed by equation (28) as follows.

$$\phi_{BB2H(T23)} = 2\phi k_H(f_{x2}-f_{x1})t + (\theta_{Hx2(2)} - \theta_{Hmx1(1)} + \theta_{HVx1(1)}) + \theta_{Bx1} + 2\pi k_L(f_{x1}t_{a1} - f_{x2}t_{a2}) - 2\pi k_l f_{x2}\tau_R \quad (28)$$

Note that $\theta_{Hx2(2)}$ is a reference time phase of the signal S5 of the frequency $k_H f_{x2}$ of the device 2A, $\theta_{Hmx1(1)}$ is a reference time phase of the signal S2 of a frequency $\{(k_H+m)n/(n-1)\}f_{x1}$ of the device 1A, and $\theta_{HVx1(1)}$ is a reference time phase of the signal S31 at this time.

Between the time $D+t_3$ and the time $D+t_4$, the device 2A receives a single wave signal of a frequency $k_H f_{x1}$ from the device 1A. A phase $\theta_{BB2H(T34)}(t)$ of a signal S7 received by the device 2A is expressed by equation (29) as follows.

$$\phi_{BB2H(T34)} = 2\pi k_H(f_{x1}-f_{x2})t + (\theta_{Hx1(2)} - \theta_{Hmx2(2)} + \theta_{HVx2(2)}) + \theta_{Bx2} - 2\pi k_L(f_{x1}t_{a1} - f_{x2}t_{a2}) - 2\pi k_H f_{x1}\tau_R \quad (29)$$

Note that a phase $\theta_{Hx1(2)}$ is a reference time phase of the signal S2 of the frequency $k_H f_{x1}$ of the device 1A, $\theta_{Hmx2(2)}$ is a reference time phase of the signal S5 of the frequency $\{(k_H+m)n/(n-1)\}f_{x2}$ of the device 2A, and $\theta_{HVx2(2)}$ is a reference time phase of the signal S61 at this time.

In the example of FIG. 3, an addition result $\phi_{BBHSUM}(t)$ of four phases is expressed by equation (30) as follows when the four phases of reception signals obtained in transmission and reception of single wave signals of a high frequency from the time $D+t_1$ to the time $D+t_4$ are respectively $\phi_{12-1H}$, $\phi_{21-1H}$, $\phi_{21-2H}$, and $\phi_{12-2H}$.

$$\phi_{BBHSUM}(t) = \phi_{12-1H} + \phi_{21-1H} + \phi_{21-2H} + \phi_{12-2H} \quad (30)$$

When equation (22) and the information on the time T are added to equation (30) described above, equation (31) as follows is obtained.

$$\phi_{BBHSUM}(t) = \phi_{BB2H(T12)}(t) + \phi_{BB2H(T23)}(t+t_0) + \phi_{BB2H(T23)}(t+T) + \phi_{BB2H(T34)}(t+T+t_0) \quad (31)$$

When equation (31) is transformed by using equation (27), equation (28), and equation (29), equation (32) and equation (33) as follows are obtained.

$$\phi_{BBHSUM}(t) = 4\pi k_H(f_{x1}+f_{x2})\tau_R + 2(\theta_{Bx1}+\theta_{Bx2}) + \theta_{HSUM} \quad (32)$$

$$\theta_{HSUM} = (\theta_{Hx1} - \theta_{Hmx2(1)} + \theta_{HVx2(1)}) + 2 \times (\theta_{Hx2(2)} - \theta_{Hmx1(1)} + \theta_{HVx1(1)}) + (\theta_{Hx1(2)} - \theta_{Hmx2(2)} + \theta_{HVx2(2)}) \quad (33)$$

When the delay $\tau_R$ corresponding to the distance between the devices is made a subject of equation (32), equation (34) as follows is obtained.

$$\tau_R = -(\theta_{Bx1}+\theta_{Bx2})/\{2\pi k_H(f_{x1}+f_{x2})\} - \theta_{HSUM}/\{4\pi k_H(f_{x1}+f_{x2})\} + \phi_{BBHSUM}(t)/\{4\pi k_H(f_{x1}+f_{x2})\} \quad (34)$$

A third term of equation (34) is the addition result of the four phases, and can be detected by measurement. However, the other terms are difficult to detect. Accordingly, correct distance measurement cannot be performed with transmission and reception of four alternations by single wave signals of a high frequency.

Next, distance measurement using two waves of a low frequency and a high frequency is considered. In other words, the delay $\tau_R$ is obtained by performing subtraction of equation (23) and equation (31) described above. Equation (35) as follows is obtained by subtraction of equation (23) and equation (31).

$$\phi_{BBLSUM}(t) - \phi_{BBHSUM}(t) = 4\pi(k_H-k_L)(f_{x1}+f_{x2})\tau_R + \theta_{LSUM} - \theta_{HSUM} \quad (35)$$

From equation (35), the delay $\tau_R$ is obtained by equation (36) as follows.

$$\tau_R = -(\theta_{LSUM} - \theta_{HSUM})/4\pi(k_H-k_L)(f_{x1}+f_{x2}) + (\phi_{BBLSUM}(t) - \phi_{BBHSUM}(t))/4\pi(k_H-k_L)(f_{x1}+f_{x2}) \quad (36)$$

A second term of equation (36) is a value that is obtained by an operation of the phases of the received single wave signals, that is, a measurement value. However, a first term in equation (36) shows addition and subtraction of the reference time phases of the signals S2 and S5 of the devices 1A and 2A that are expressed by equation (25) and equation (33). The reference time phases of the signals S2 and S5 are as shown in FIG. 4 in the distance measurement sequence in FIG. 3. In the proposal of Patent Literature 1, accurate distance measurement is possible by cancelling components of the initial phase by using the condition that the reference time phase when the reference time is time 0, in other words, the initial phase does not change in the distance measurement sequence. However, when a DCO direct modulation method and a sliding IF method are used, the initial phase changes each time the frequency setting is changed as in FIG. 4, so that the first term of equation (36) described above cannot be obtained, and the propagation delay time $\tau_R$ cannot be accurately calculated. Since a distance can be calculated by multiplying the propagation delay time period by a light velocity, the distance cannot be accurately calculated in other words.

Note that the above described explanation shows the problem that the distance measurement cannot be accurately performed due to the fluctuations of the initial phases of the output signals of mpl1A and mpl2A that are local oscillators in the distance measuring devices. However, it is conceivable that not only the distance measuring device but also various devices that detect the phases of signals by using local oscillators may not be able to achieve desired functions due to fluctuation in the initial phases of the output signals. The present embodiment is applicable to the various devices that detect the phases of signals by using the local oscillators like this.

(Correction Method of Initial Phase that Fluctuates)

In the present embodiment, it is made possible to achieve a same function as in a case where an initial phase is not changed, in a device using a local oscillator and a frequency divider, by adopting the local oscillator and a phase detector for calculating an output phase of the frequency divider by detecting a phase at a timing based on a frequency as a common factor of a frequency of initial setting and a reset frequency, obtaining a difference between a phase before frequency resetting and a phase after frequency resetting, which are detected by the phase detector, obtaining a fluctuation amount of the phase by an phase change and a frequency change, and correcting the phase according to the obtained fluctuation amount.

(Distance Measuring Device)

In FIG. 1, devices 1 and 2 that are distance measuring devices each has a configuration using a digitally controlled oscillator (DCO) direct modulation method for a transmission unit, and using a sliding IF method for a reception unit. A distance measuring system 100 of the present embodiment includes the device 1 and the device 2, and at least one of the device 1 and the device 2 is movable. The device 1 transmits a first distance measurement signal (single wave signal), and the device 2 transmits a second distance measurement signal (single wave signal). The first and the second distance measurement signals respectively reach the device 2 and the device 1 via the propagation path PDLY between the device 1 and the device 2.

In FIG. 1, the device 1 has an oscillator (OSC1) peculiar to the device, a frequency multiplier (mpl1), an RF frequency converter (RFMIX1), a first frequency divider (div11), a second frequency divider (div12), a first intermediate (1stIF) frequency converter (IFMIX11), and a second intermediate (2ndIF) frequency converter (IFMIX12). The device 2 has a same configuration as the configuration of the device 1, and has an oscillator (OSC2) peculiar to the device, a frequency multiplier (mpl2), an RF frequency converter (RFMIX2), a first frequency divider (div21), a second frequency divider (div22), a first intermediate (1stIF) frequency converter (IFMIX21), and a second intermediate (2ndIF) frequency converter (IFMIX22).

In other words, a main point where the devices 1 and 2 respectively differ from the devices 1A and 2A in FIG. 2 is that the devices 1 and 2 respectively adopt mpl1 and mpl2 in place of mpl1A and mpl2A. In mpl1 and mpl2, respective outputs become transmission signals of the devices 1 and 2, and are also used as local signals (LO signal). In other words, mpl1 and mpl2 respectively configure local oscillators.

An LO signal similar to the LO signal of mpl1A or mpl2A can be generated by each of mpl1 and mpl2. Accordingly, in the present embodiment, the distance measurement sequence illustrated in FIG. 3 can also be carried out, and equation (36) described above obtaining the delay $\tau_R$ corresponding to the distance between the devices is established. The present embodiment enables accurate distance measurement by obtaining the value of the first term of equation (36) described above by adopting mpl1 and mpl2.

Figure 7:
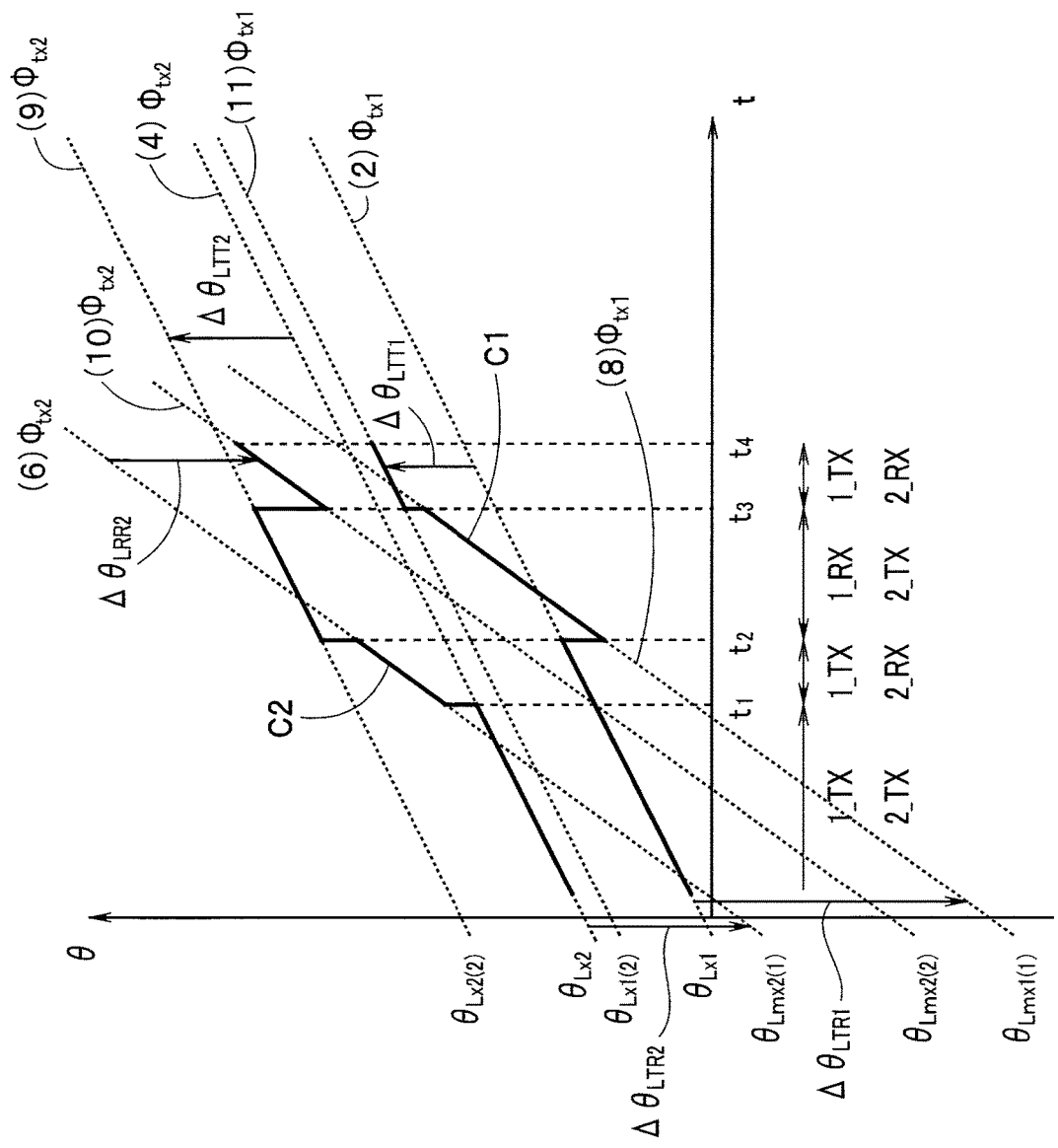
FIG. 7 is a diagram in which arrows explaining information on five kinds of phase differences are added to a graph similar to the graph of FIG. 4.

First, with reference to a graph in FIG. 7, 10 kinds of phase differences that are necessary to calculate the first term of equation (36) described above will be described. FIG. 7 is a diagram in which arrows explaining information on the five kinds of phase differences in the low frequency are added to a graph similar to the graph in FIG. 4. Note that in FIG. 7 and FIG. 8 described later, a case of $t_{a1}=t_{a2}$ is illustrated for easy understanding of phase change, and a time at an intersection point of a vertical axis and a horizontal axis is illustrated as the time $t_{a1}$ or the time $t_{a2}$. In addition, TT included in subscripts in signs indicating the five kinds of phase differences is related to a fluctuation in a phase of a signal, the frequency of which is multiplied by $k_L$ (by $k_H$ in FIG. 8, being the same in the following), RR is related to a fluctuation in a phase of a signal, the frequency of which is multiplied by $\{(k_L+m)n/(n-1)\}$, and TR is related to changes of the phase of the signal, the frequency of which is multiplied by $k_L$ and the phase of the signal, the frequency of which is multiplied by $\{(k_L+m)n/(n-1)\}$. Further, L included in the subscripts in the signs indicating the phase differences indicates that the single wave signal has a low frequency, H indicates that a single wave signal has a high frequency, 1 indicates that a phase difference is related to the signal S2, and 2 indicates that a phase difference is related to the signal S5.

As described above, the devices 1 and 2 perform initial settings of transmission frequencies by the time $t_1$ in FIG. 3. In other words, the device 1 and the device 2 respectively have the transmission frequencies set at $k_L f_{x1}$ and $k_L f_{x2}$ by mpl1 and mpl2. Explaining the distance measurement sequence in the low frequency in FIG. 3 again, the reference time phase of the output signal S2 of mpl1 of the device 1 changes to a reference time phase $\theta_{Lx1}$ before the time $t_2$, a reference time phase $\theta_{Lmx1(1)}$ from the time $t_2$ to the time $t_3$, and a reference time phase $\theta_{Lx1(2)}$ from the time $t_3$ to the time $t_4$. As for the device 2, the reference time phase of the output signal S5 of mpl2 changes to a reference time phase $\theta_{Lx2}$ before the time $t_1$, a reference time phase $\theta_{Lmx2(1)}$ from the time $t_1$ to the time $t_2$, a reference time phase $\theta_{Lx2(2)}$ from the time $t_2$ to the time $t_3$, and a reference time phase $\theta_{Lmx2(2)}$ from the time $t_3$ to the time $t_4$.

Phase differences $\Delta\theta_{LTT1}$ and $\Delta\theta_{LTR1}$ in FIG. 7 are phase differences concerning the device 1. The phase difference $\Delta\theta_{LTT1}$ is a difference between the reference time phase $\theta_{Lx1(2)}$ from the time $t_3$ to the time $t_4$ and the reference time phase $\theta_{Lx1}$ before the time $t_2$ in the signal S2. The phase difference $\Delta\theta_{LTR1}$ is a difference between the reference time phase $\theta_{Lmx1(1)}$ from the time $t_2$ to the time $t_3$ and the reference time phase $\theta_{Lx1}$ before the time $t_2$ in the signal S2. In addition, $\theta_{LVx1(1)}$ not illustrated is a reference time phase of the signal S31 obtained by multiplying the signal S2 at this time by (1/n). When n is a natural number, a frequency divider is a circuit configured to simply divide a frequency of an input signal by an integer, and thus relationships among these variables can be respectively expressed by equation (37), equation (38), and equation (38a).

$$\theta_{Lx1(2)}=\theta_{Lx1}+\Delta\theta_{LTT1} \quad (37)$$

$$\theta_{Lmx1(1)}=\theta_{Lx1}+\Delta\theta_{LTR1} \quad (38)$$

$$\theta_{LVx1(1)}=\theta_{Lmx1(1)}/n=(\theta_{Lx1}+\Delta\theta_{LTR1})/n \quad (38a)$$

Further, phase differences $\Delta\theta_{LTT2}$, $\Delta\theta_{LRR2}$, and $\Delta\theta_{LTR2}$ are phase differences concerning the device 2. The phase difference $\Delta\theta_{LTT2}$ is a difference between the reference time phase $\theta_{Lx2(2)}$ from the time $t_2$ to the time $t_3$ and the reference time phase $\theta_{Lx2}$ before the time $t_1$ in the signal S5. The phase difference $\Delta\theta_{LRR2}$ is a difference between the reference time phase $\theta_{Lmx2(2)}$ from the time $t_3$ to the time $t_4$ and the reference time phase $\theta_{Lmx2(1)}$ from the time $t_1$ to the time $t_2$ in the signal S5. The phase difference $\Delta\theta_{LTR2}$ is a difference between the reference time phase $\theta_{Lmx2(1)}$ from the time $t_1$ to the time $t_2$ and the reference time phase $\theta_{Lx2}$ before the time $t_1$ in the signal S5. In addition, $\theta_{Lvx2(1)}$ not illustrated is a reference time phase of the signal S61 obtained by multiplying the signal S5 between the time $t_1$ and the time $t_2$ by (1/n), and $\theta_{LVx2(2)}$ is a reference time phase of the signal S61 obtained by multiplying the signal S5 between the time $t_3$ and the time $t_4$ by (1/n). Relationships among these variables can be respectively expressed by equation (39) to equation (41a) as follows.

$$\theta_{Lx2(2)}=\theta_{Lx2}+\Delta\theta_{LTT2} \quad (39)$$

$$\theta_{Lmx2(1)}=\theta_{Lx2}+\Delta\theta_{LTR2} \quad (40)$$

$$\theta_{Lvx2(1)}=\theta_{Lmx2(1)}/n=(\theta_{Lx2}+\Delta\theta_{LTR2})/n \quad (40a)$$

$$\theta_{Lmx2(2)}=\theta_{Lmx2(1)}+\Delta\theta_{LRR2}=\theta_{Lx2}+\Delta\theta_{LRT2}+\Delta\theta_{LRR2} \quad (41)$$

$$\theta_{Lvx2(2)}=\theta_{Lmx2(2)}/n=(\theta_{Lx2}+\Delta\theta_{LTR2}+\Delta\theta_{LRR2})/n \quad (41a)$$

As will be described later, of the phase differences, $\Delta\theta_{LTT1}$, $\Delta\theta_{LTT2}$, and $\Delta\theta_{LRR2}$ can be directly measured by mpl1 and mpl2. On the other hand, $\Delta\theta_{LTR1}$ in equation (38) and $\Delta\theta_{LTR2}$ in equation (40) cannot be directly measured. Therefore, in the present embodiment, mpl1 and mpl2 obtain $\Delta\theta_{LTR1}$ and $\Delta\theta_{LTR2}$ by measuring the phase differences relating to $\Delta\theta_{LTR1}$ and $\Delta\theta_{LTR2}$ as will be described later.

Here, in order to show a concept of a reference time phase measurement method, $\Delta\theta_{LTR1}$ and $\Delta\theta_{LTR2}$ will be described as measurable.

When equation (37) to equation (41) described above are substituted into $\theta_{LSUM}$ in equation (25) described above, $\theta_{LSUM}$ in equation (36) described above is given by equation (42) as follows.

$$\theta_{LSUM}=(2\times\Delta\theta_{LTR1}+2\times\Delta\theta_{LTR2}+\Delta\theta_{LRR2})\times(n-1)/n+\Delta\theta_{LTT1}+2\times\Delta\theta_{LTT2}+2\times(\theta_{Lx1}+\theta_{Lx2})/n \quad (42)$$

Next, $\theta_{HSUM}$ in the high frequency shown in equation (33) is obtained.

Figure 8:
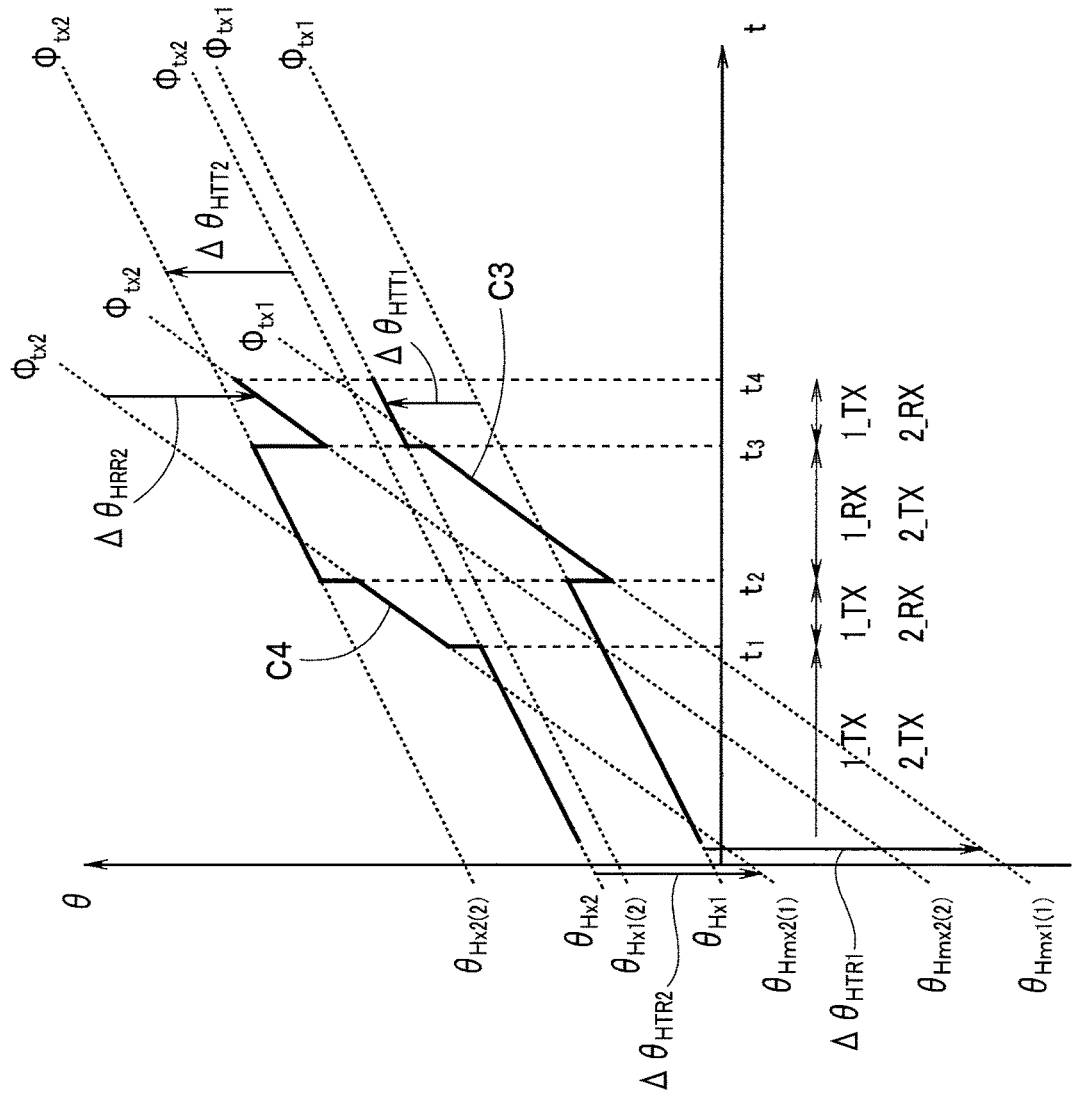
FIG. 8 is a diagram in which arrows explaining information on five kinds of phase differences are added to a graph similar to the graph of FIG. 4.

A graph in FIG. 8 shows a transition of the reference time phases of the signals S2 and S5 in the distance measurement sequence of the high frequency, and explains five kinds of phase differences that are necessary for calculation of a first term in equation (36) described above, similarly to FIG. 7. FIG. 8 is a diagram in which arrows explaining information on the five kinds of phase differences are added to a graph similar to the graph in FIG. 4. Note that the graph in FIG. 8 illustrates an example having a characteristic of a same shape as the shape of the graph in FIG. 7 to simplify explanation, but does not have to have the characteristic of the same shape as in FIG. 7. Further, for concise explanation, "D+" in the time D+$t_1$ in explanation for the high frequency is omitted as appropriate, and the time is expressed as the time $t_1$.

As indicated by a thick line characteristic C3, the reference time phase of the signal S2 from mpl1 of the device 1 changes to the reference time phase $\theta_{Hx1}$ before the time $t_2$, the reference time phase $\theta_{Hmx1(1)}$ from the time $t_2$ to the time $t_3$, and the reference time phase $\theta_{Hx1(2)}$ from the time $t_3$ to the time $t_4$. The reference time phase of the signal S5 from mpl2 of the device 2 changes to the reference time phase $\theta_{Hx2}$ before the time $t_1$, the reference time phase $\theta_{Hmx2(1)}$ from the time $t_1$ to the time $t_2$, the reference time phase $\theta_{Hx2(2)}$ from the time $t_2$ to the time $t_3$, and the reference time phase $\theta_{Hmx2(2)}$ from the time $t_3$ to the time $t_4$.

Phase differences $\Delta\theta_{HTT1}$ and $\Delta\theta_{HTR1}$ are phase differences concerning the device 1. The phase difference $\Delta\theta_{HTT1}$ is a difference between the reference time phase $\theta_{Hx1(2)}$ from the time $t_3$ to the time $t_4$ and the reference time phase $\theta_{Hx1}$ before the time $t_2$ in the signal S2. The phase difference $\Delta\theta_{HTR1}$ is a difference between the reference time phase $\theta_{Hmx1(1)}$ from the time $t_2$ to the time $t_3$ and the reference time phase $\theta_{Hx1}$ before the time $t_2$ in the signal S2. In addition, $\theta_{HVx1(1)}$ not illustrated is a reference time phase of the signal S31 obtained by multiplying the signal S2 at this time by (1/n). Relationships among these variables are respectively expressed by equation (43), equation (44), and equation (44a).

$$\theta_{Hx1(2)} = \theta_{Hx1} + \Delta\theta_{HTT1} \tag{43}$$

$$\theta_{Hmx1(1)} = \theta_{Hx1} + \Delta\theta_{HTR1} \tag{44}$$

$$\theta_{HVx1(1)} = \theta_{Hmx1(1)}/n = (\theta_{Hx1} + \Delta\theta_{HTR1})/n \tag{44a}$$

Similarly, phase differences $\Delta\theta_{HTT2}$, $\Delta\theta_{HRR2}$, and $\Delta\theta_{HTR2}$ are phase differences concerning the device 2. The phase difference $\Delta\theta_{HTT2}$ is a difference between the reference time phase $\theta_{Hx2(2)}$ from the time $t_2$ to the time $t_3$ and the reference time phase $\theta_{Hx2}$ before the time $t_1$ in the signal S5. The phase difference $\Delta\theta_{HRR2}$ is a difference between the reference time phase $\theta_{Hmx2(2)}$ from the time $t_3$ to the time $t_4$ and the reference time phase $\theta_{Hmx2(1)}$ from the time $t_1$ to the time $t_2$ in the signal S5. The phase difference $\Delta\theta_{HTR2}$ is a difference between the reference time phase $\theta_{Hmx2(1)}$ from the time $t_1$ to the time $t_2$ and the reference time phase $\theta_{Hx2}$ before the time $t_1$ in the signal S5. In addition, $\theta_{HVx2(1)}$ not illustrated is a reference time phase of the signal S61 obtained by multiplying the signal S5 between the time $t_1$ and the time $t_2$ by (1/n), and $\theta_{HVx2(2)}$ is a reference time phase of the signal S61 obtained by multiplying the signal S5 between the time $t_3$ and the time $t_4$ by (1/n). Relationships among these variables can be respectively expressed by equation (45) to equation (47a) as follows.

$$\theta_{Hx2(2)} = \theta_{Hx2} + \theta_{HTT2} \tag{45}$$

$$\theta_{Hmx2(1)} = \theta_{Hx2} + \Delta\theta_{HTR2} \tag{46}$$

$$\theta_{HVx2(1)} = \theta_{Hmx2(1)}/n = (\theta_{Hx2} + \Delta\theta_{HTR2})/n \tag{46a}$$

$$\theta_{Hmx2(2)} = \theta_{Hmx2(1)} + \Delta\theta_{HRR2} = \theta_{Hx2} + \Delta\theta_{HTR2} + \Delta\theta_{HRR2} \tag{47}$$

$$\theta_{HVx2(2)} = \theta_{Hmx2(2)}/n = (\theta_{Hx2} + \Delta\theta_{HTR2} + \Delta\theta_{HRR2})/n \tag{47a}$$

Further, a difference between $\theta_{Lx1}$ and $\theta_{Hx1}$ and a difference between $\theta_{Lx2}$ and $\theta_{Hx2}$ are respectively defined as $\theta_{LHx1}$ and $\Delta\theta_{LHx2}$ and expressed by expressions as follows.

$$\theta_{Hx1} = \theta_{Lx1} + \Delta\theta_{LHx1} \tag{47b}$$

$$\theta_{Hx2} = \theta_{Lx2} + \Delta\theta_{LHx2} \tag{47c}$$

As in the case of the low frequency, of the above phase differences, $\Delta\theta_{HTT1}$, $\Delta\theta_{HTT2}$, and $\Delta\theta_{HRR2}$ can be directly measured by mpl1 and mpl2. On the other hand, $\Delta\theta_{HTR1}$ in equation (44) and $\Delta\theta_{HTR2}$ in equation (46) cannot be directly measured. Therefore, in the present embodiment, mpl1 and mpl2 obtain $\Delta\theta_{HTR1}$ and $\Delta\theta_{HTR2}$ by measuring the phase differences relating to $\Delta\theta_{HTR1}$ and $\Delta\theta_{HTR2}$ as will be described later. Further, a method of calculating $\Delta\theta_{LHx1}$ and $\Delta\theta_{LHx2}$ will be described later.

Here, in order to show a concept of a reference time phase measurement method, $\Delta\theta_{HTR1}$, $\Delta\theta_{HTR2}$, $\Delta\theta_{LHx1}$, and $\Delta\theta_{LHx2}$ are will be described as measurable.

When equation (43) to equation (47c) described above are substituted into $\theta_{HSUM}$ in equation (25) described above, $\theta_{HSUM}$ in equation (36) described above is given by equation (48) as follows.

$$\theta_{HSUM} = -(2\times\Delta\theta_{HTR1} + 2\times\Delta\theta_{HTR2} + \Delta\theta_{HRR2})\times(n-1)/n + \Delta\theta_{HTT1} + 2\times\Delta\theta_{HTT2} + 2\times(\Delta\theta_{LHx1} + \Delta\theta_{LHx2})/n + 2\times(\theta_{Lx1} + \theta_{Lx2})/n \tag{48}$$

As above, the term of $2\times(\theta_{Lx1}+\theta_{Lx2})/n$ is cancelled by equation (42) and equation (48) described above when the first term in equation (36) described above is calculated, and thus it is possible to obtain the first term in equation (36).

In thick line characteristics C1 to C4 in FIG. 7 and FIG. 8, sections where inclinations are small are transmission sections, and sections where inclinations are large are reception sections. Note that when one of the devices 1 and 2 is in the transmission section, the other one is in the reception section. In equation (42) and equation (48) described above, the phase differences $\Delta\theta_{LTT1}$, $\Delta\theta_{LTT2}$, $\Delta\theta_{HTT1}$, and $\Delta\theta_{HTT2}$ express the phase differences between the respective RF signals in the two transmission sections with the reception section sandwiched between the two transmission sections, in the respective devices 1 and 2. The phase differences $\Delta\theta_{LRR2}$, and $\Delta\theta_{HRR2}$ express the phase differences between the respective RF signals of the two reception sections with the transmission section sandwiched between the two reception sections. The phase differences $\Delta\theta_{LTR1}$, $\Delta\theta_{LTR2}$, $\Delta\theta_{HTR1}$ and $\Delta\theta_{HTR2}$ each expresses the phase difference between the respective RF signals of the continuous transmission section and reception section. The former two are the reference time phase differences of the same frequency, and the latter two are the reference time phase differences of different frequencies. Further, $\Delta\theta_{LHx1}$ and $\Delta\theta_{LHx2}$ are phase differences between the respective RF signals in a first transmission section at the low frequency and the high frequency. When a total of four kinds of "the phase difference between the respective RF signals in the two transmission sections" (hereinafter also referred to as a first phase difference), "the phase difference between the respective RF signals in the two reception sections" (hereinafter also referred to as a second phase difference), "the phase difference between the respective RF signals in the continuous transmission section and reception section" (hereinafter also referred to as a third phase difference), "the phase difference between the respective RF signals in the first transmission section at the low frequency and the high frequency" (hereinafter also referred to as a fourth phase difference) can be obtained, it becomes possible to perform accurate distance measurement by equation (36) described above.

In the present embodiment, the four kinds of phase differences or information for obtaining the four kinds of phase differences are obtained by mpl1 and mpl2. in FIG. 1, Information concerning the obtained phase differences is outputted to the operation devices CA1 and CA2 by mpl1 and mpl2 respectively. The operation devices CA1 and CA2 are respectively given signals S12 and S9 from IFMIX1 and IFMIX2, and detect phases of the signals S12 and S9. The operation device CA1 performs an operation of equation (36) described above to obtain the delay $\tau_R$ and further obtains the distance R, by using phase information obtained from the signal S12 and information concerning the phase difference from mpl1. Note that in the device 2, the operation device CA2 can also perform an operation of equation (36) described above to obtain the delay $\tau_R$ and further obtain the distance R, by using phase information obtained from the signal S9 and the information concerning the phase difference from mpl2. Note that the operation devices CA1 and CA2 can respectively perform various kinds of control concerning distance measurement in the devices 1 and 2, for example, frequency setting, timing control and the like in the distance measurement sequence.

(Specific Configuration)

Figure 9:
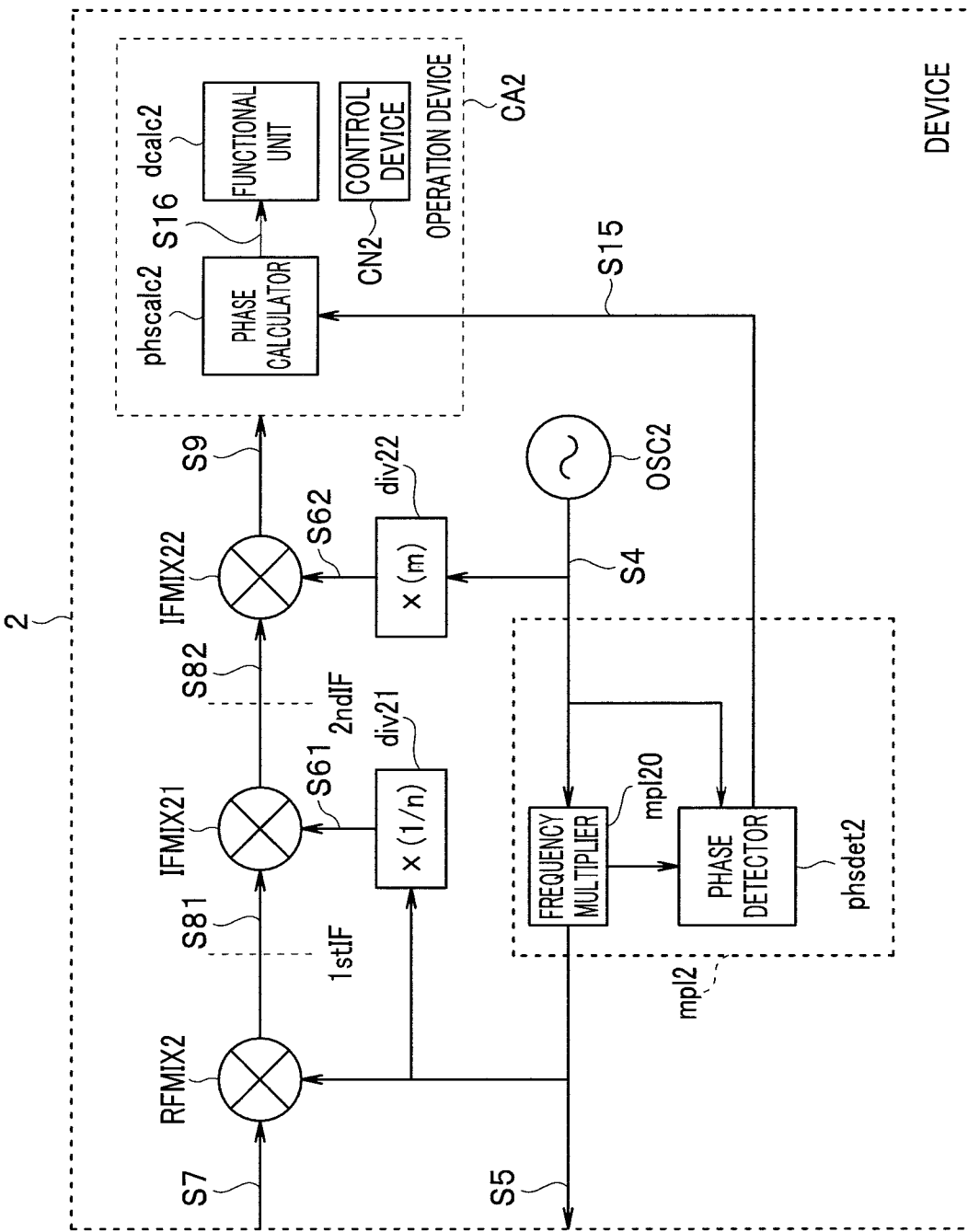
FIG. 9 is a block diagram illustrating the distance measuring device including the phase fluctuation detecting device and the phase correcting device according to the embodiment.

FIG. 9 is a block diagram illustrating the distance measuring device including the phase fluctuation detecting device and the phase correcting device according to the embodiment, and illustrates a specific configuration of mpl2 that calculates the information concerning the above described four kinds of phase differences in the device 2. Further, the configuration of mpl1 of the device 1 is also similar to the configuration in FIG. 9, and illustration and explanation will be omitted. Note that in FIG. 9, the phase fluctuation detecting device is mainly configured by OSC2 and mpl2, and the phase correcting device is configured by OSC2, mpl2, a phase calculator phscalc2, and a functional unit dcalc2. As described above, it is possible to use the phase fluctuation detecting device and the phase correcting device not only in the distance measuring device, but also in various devices that detect phases of inputted signals, and in that case, in the phase correcting device, other circuits that correct the phase of the input signal according to the fluctuation amount of the reference time phase by using the output of mpl2 are adopted, instead of the phase calculator phscalc2 and the functional unit dcalc2.

A frequency multiplier mpl20 and a phase detector phsdet2 configure mpl2. The frequency multiplier mpl20 has a same function as the function of mpl2A in FIG. 2. In other words, the frequency multiplier mpl20 configures a local oscillator, is given a signal S4 that is an oscillation output of OSC2, multiplies a frequency of the signal S4 by a predetermined amount, generates and outputs the signal S5 that is a local oscillation signal. Note that a multiplication number by the frequency multiplier mpl20 is designated by a control device CN2 of the operation device CA2. The control device CN2 generates frequency control data for determining the multiplication number of the frequency multiplier mpl20.

The signal S5 is given to RFMIX2 as an LO signal in the reception section of the distance measurement, and is transmitted as the single wave signal in the transmission section of the distance measurement. The frequency multiplier mpl20 can also output information on a phase of the signal S5 to the phase detector phsdet2.

The information on the phase of the signal S5 and the signal S4 that is the oscillation output of OSC2 are inputted to the phase detector phsdet2.

The phase detector phsdet2 acquires, based on the inputted information, information for obtaining the above-described 43 kinds of phase differences at a timing specified by the control device CN2 of the operation device CA2, and outputs the acquired information (S15) to the operation device CA2.

The operation device CA2 is configured by a phase calculator phscalc2, a functional unit dcalc2 and a control device CN2. The control device CN2 controls operations of the phase calculator phscalc2 and the functional unit dcalc2 that configure a correction circuit, and controls mpl2 and div2. The control device CN2 is capable of frequency control, timing control and the like concerning distance measurement in the device 2, and can also set the aforementioned frequency control data, for example.

The phase calculator phscalc2 obtains $\theta_{LSUM}$ and $\theta_{HSUM}$ of equation (36) described above to output $\theta_{LSUM}$ and $\theta_{HSUM}$ to the functional unit dcalc2, by using the output of the phase detector phsdet2. The operation device CA2 is also given a signal S9 from IFMIX22, and the functional unit dcalc2 obtains the delay $\tau_R$ by an operation of equation (36) described above from the output of the phase calculator phscalc2 and the signal S9, and further calculates the distance R.

Figure 10:
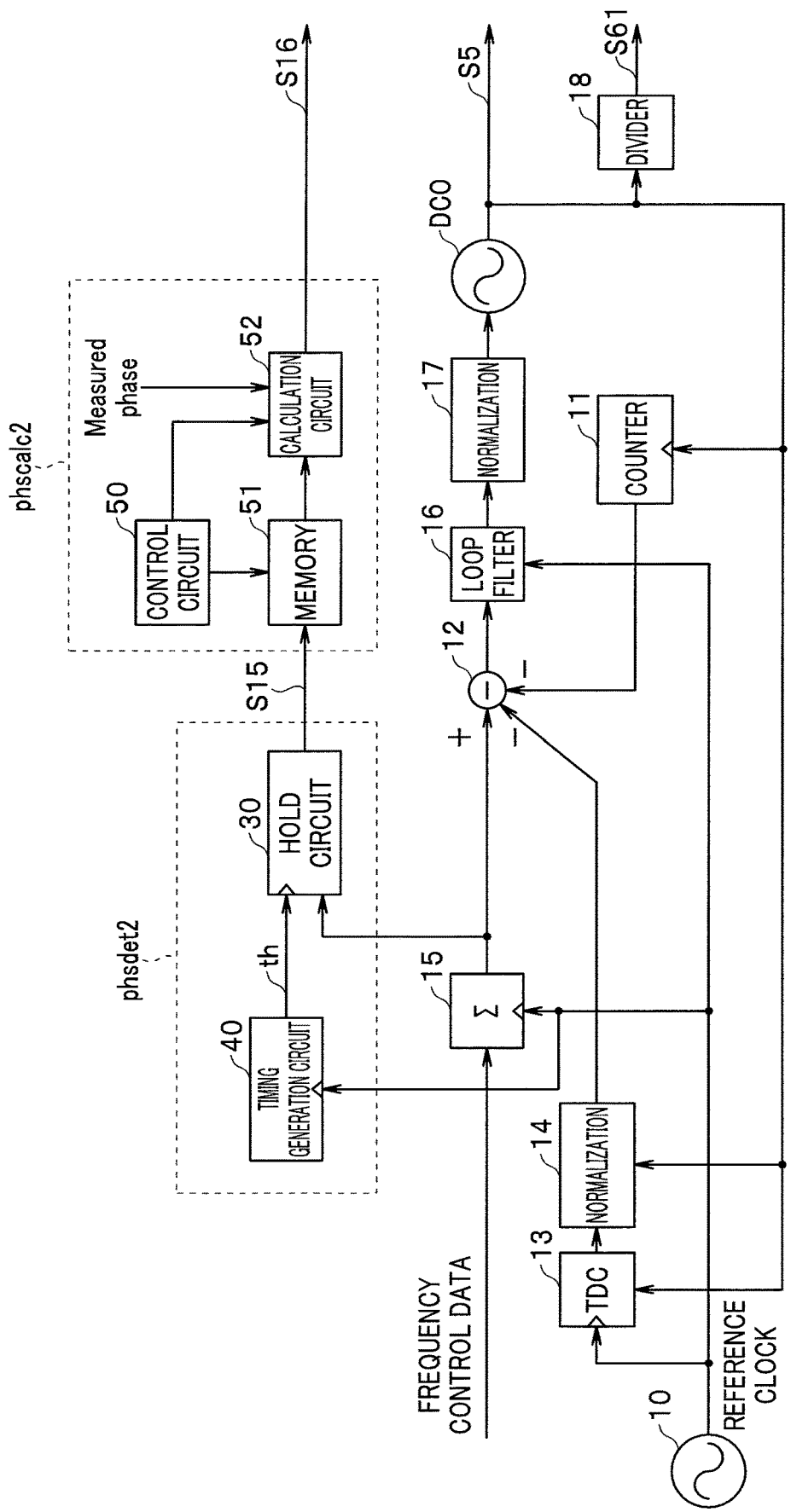
FIG. 10 is a circuit diagram illustrating a more specific configuration of part of mpl2 and a phase calculator phscalc2.

FIG. 10 is a circuit diagram illustrating a more specific configuration of mpl2 and the phase calculator phscalc2. Note that a configuration of mpl1 and the phase calculator phscalc1 of the device 1 is also similar to the configuration in FIG. 10, and illustration and explanation will be omitted.

A frequency multiplier mpl20 includes a circuit part of a frequency multiplier of an ordinary configuration including an ADPLL (all digital phase-locked loop) including a digitally controlled oscillator (DCO). The digitally controlled oscillator DCO generates an oscillation output of an oscillation frequency corresponding to an inputted digital value and outputs the oscillation output. As will be described later, at a time of lock of the ADPLL, the digitally controlled oscillator DCO generates an oscillation output of a frequency that is a rational multiple of a frequency of the reference clock that is generated by the reference oscillator 10. Note that the reference oscillator 10 corresponds to OSC2 in FIG. 1 and FIG. 9.

The oscillation output of the digitally controlled oscillator DCO is outputted as the signal S and supplied to a counter 11. The counter 11 counts the oscillation output of the digitally controlled oscillator DCO, and a count value of the counter 11 is outputted to a subtractor 12. The counter 11 counts a number of waves (number of pulses) of the oscillation output of the digitally controlled oscillator DCO. A count value of the counter 11 in one period of the reference clock indicates how many integer multiples of the reference clock, for example, the oscillation output of the digitally controlled oscillator DCO is.

The oscillation output of the digitally controlled oscillator DCO is also supplied to TDC13. TDC13 may be configured by a plurality of delay elements of a delay time sufficiently shorter than the period of the oscillation output. TDC13 is also given the reference clock, and TDC13 obtains a delay time (corresponding to a phase difference) between the oscillation output of the digitally controlled oscillator DCO and the reference clock, and outputs the delay time to a normalization circuit 14. The normalization circuit 14 normalizes the output of TDC13 with one period of the reference clock as 1. In other words, an output of the normalization circuit 14 indicates that how many decimal multiples of the reference clock period the output (delay time) of TDC13 is, and indicates the phase difference between the output of the digitally controlled oscillator DCO and the reference clock. The output of the normalization circuit 14 is supplied to the subtractor 12.

An integrator (Σ) 15 is given frequency control data and the reference clock. The frequency control data indicates a multiplication number of a rational number to the reference clock, which is a value of a ratio of a desired oscillation output frequency of the digitally controlled oscillator DCO and a reference clock frequency. The integrator 15 integrates the frequency control data at each reference clock, and outputs an integration result to the subtractor 12.

An output of the counter 11 is an integration result of an integer multiplication number of the frequency of the output of the digitally controlled oscillator DCO to the reference clock, and the output of the normalization circuit 14 is a decimal multiplication number of the frequency of the output of the digitally controlled oscillator DCO to the reference clock. The outputs of the counter 11 and the normalization circuit 14 each indicates a multiplication number of a rational number of the frequency of the output of the digitally controlled oscillator DCO that is oscillating to the reference clock. In other words, the outputs of the counter 11 and the normalization circuit 14 each indicates a present phase of the output of the digitally controlled oscillator DCO with the reference clock as a reference.

The subtractor 12 obtains a phase error by subtracting the outputs of the counter 11 and the normalization circuit 14 from an output of the integrator 15. The subtractor 12 gives the obtained phase error to the digitally controlled oscillator DCO via a loop filter 16 and a normalization circuit 17. Thereby, the oscillation output of the digitally controlled oscillator DCO changes in frequency so that an output of the subtractor 12 becomes zero. Note that the loop filter 16 operates at reference clock periods, and the normalization circuit 17 normalizes an output of the loop filter 16 to information suitable for frequency control of the digitally controlled oscillator DCO and gives the information to the digitally controlled oscillator DCO. In this way, at a time of lock of the ADPLL, an oscillation output of a frequency of a rational number multiple based on the frequency control data of the reference clock is obtained from the digitally controlled oscillator DCO.

As described above, the outputs of the counter 11 and the normalization circuit 14 each indicates the present phase of the output of the digitally controlled oscillator DCO with the reference clock as a reference, and when a phase difference of an integer multiple of 2π (360 degrees) as the output of the counter 11 is neglected, the output of the normalization circuit 14 indicating a decimal multiplication number indicates a present phase of the output of the digitally controlled oscillator DCO with the reference clock as the reference. At the time of lock, the output of the subtractor 12 becomes zero, so that the output of the integrator 15 also indicates a present phase of the output of the digitally controlled oscillator DCO with the reference clock as the reference.

The oscillation output of the digitally controlled oscillator DCO is also supplied to a frequency divider 18. The frequency divider 18 corresponds to div21 in FIGS. 1 and 9. The frequency divider 18 divides a frequency of an inputted signal by n and outputs the signal as the signal S61. The frequency divider 18 and the counter 11 are circuits configured to operate by counting the oscillation output of the digitally controlled oscillator DCO and essentially perform equivalent operation, and thus a current phase of an output signal of the frequency divider 18 can be determined from a remainder of division of an output of the counter 11 by n.

Specifically, at lock, a value obtained by dividing, by n, a sum of a remainder of division of an output of an integer multiplication number corresponding to a phase difference of an integral multiple of 2π in the output of the integrator 15 by n and a decimal multiplication number indicates the current phase of the output of the frequency divider 18 with respect to the reference clock. For example, when the counter 11 and the integrator 15 operate in binary numbers and n is eight, the phase of the output signal of the frequency divider 18 corresponds to three lowermost bits of the counter 11, and a value obtained by dividing, by eight, a sum of three lowermost bits of an integer multiplication number part and a decimal multiplication number part in the output of the integrator 15 matches the current phase of the output of the frequency divider 18 with respect to the reference clock.

In the present embodiment, a sum of the integer multiplication number (at least three lowermost bits for n=8) corresponding to the phase difference of an integral multiple of 2π and the decimal multiplication number in the output of the integrator 15 is output to a hold circuit 30 as the current phase of the output of the digitally controlled oscillator DCO or the current phase of the output of the frequency divider 18 with respect to the reference clock.

The phase detector phsdet2 in FIG. 9 is configured by a timing generation circuit 40 and the hold circuit 30, and the phase calculator phscalc2 in FIG. 9 is configured by a control circuit 50, a memory 51, and a calculation circuit 52. The hold circuit 30 holds, based on a timing signal th given by the timing generation circuit 40, a phase (hereinafter referred to as an output phase of the integrator 15) indicated by the output of the integrator 15, and outputs the held and acquired phase to the memory 51.

The timing signal th given by the timing generation circuit 40 will be explained. A common multiple extended to a real number is defined as follows. "When M non-zero integers $q_i$ that satisfy $r_i \times q_i = c$ exist for M real numbers $r_i$ (i is 1 to M), a real number c is referred to as a common multiple of the real numbers $r_i$". The timing signal th is a signal indicating all timings or one or more timings of the all timings of a period equal to common multiples of the periods of all signals needed for the reference clock, the output of the digitally controlled oscillator DCO, and the output of the frequency divider 18. Further, when the frequency of the reference clock is set as $f_1$, frequencies of all signals needed for the frequency of the reference clock, the output of the digitally controlled oscillator DCO, and the output of the frequency divider 18 are set as $f_i$, and the non-zero integer $q_i$ that gives the common multiple c described above is used, it is clear that equation (49) holds since frequency is reciprocal of period.

$$q_1/f_1 = q_i/f_i \quad (49)$$

Equation (49) can be rewritten as follows.

$$f_i/f_1 \times q_1 = q_i \quad (50)$$

Since $q_i$ is an integer, multiplication of a value obtained by normalizing an output frequency of the digitally controlled oscillator DCO and an output frequency of the frequency divider 18 ($f_i$) by the frequency ($f_1$) of the reference clock, by the non-zero integer $q_1$ that gives the common multiple c described above results in an integer for any $f_i$. Thus, the integer $q_1$ may be determined based on a frequency relationship.

In the present embodiment, the timing signal th is generated through frequency division of the reference clock. A predetermined frequency division number is p, and the timing signal th is a signal of an interval that is p times longer than the reference clock period, or is a signal obtained by thinning the signal of the interval that is p times longer than the reference clock period. In this case, p is determined so that a period of a signal obtained through p frequency division of the reference clock is equal to a common multiple of a period of the output signal of the digitally controlled oscillator DCO and a period of the output signal of the frequency divider 18. For explanation of a specific p determination method, equation (4), equation (6), equation (6a), equation (9), equation (10), and equation (10a) are listed below again.

$$\phi_{tx2}=2\pi k_L f_{x2}t+\theta_{Lx2} \quad (4)$$

$$\phi_{tx2}=2\pi\{(k_L+m)n/(n-1)\}f_{x2}t+\theta_{Lmx2(1)} \quad (6)$$

$$\phi_{v2}=2\pi\{(k_L+m)/(n-1)\}f_{x2}t+\theta_{Lvx2(1)} \quad (6a)$$

$$\phi_{tx2}=2\pi k_L f_{x2}t+\theta_{Lx2(2)} \quad (9)$$

$$\phi_{tx2}=2\pi\{(k_L+m)n/(n-1)\}f_{x2}t+\theta_{Lmx2(2)} \quad (10)$$

$$\phi_{v2}=2\pi\{(k_L+m)/(n-1)\}f_{x2}t+\theta_{Lvx2(2)} \quad (10a)$$

Since $k_L$ is changed to $k_H$ only in a case of the high frequency, the following explanation is performed with k in place of $k_L$. It can be understood from these equations that, for one k, three frequencies of $kf_{x2}$, $\{(k+m)n/(n-1)\}f_{x2}$, and $\{(k+m)/(n-1)\}f_{x2}$ are needed for the digitally controlled oscillator DCO and the output of the frequency divider 18. Since the frequency of the reference clock of the device 2 is $f_{x2}$, it suffices to determine p with which $k\times p$, $\{(k+m)n/(n-1)\}\times p$, and $\{(k+m)/(n-1)\}\times p$ are integers. In this case, the timing signal th is a signal of a period equal to a common multiple of the periods of all signals needed for the output of the digitally controlled oscillator DCO and the output of the frequency divider 18. When there are k in plurality, the number of needed frequencies increases accordingly.

Explanation is performed on a specific calculation example when p is a natural number. For example, when n is eight, $f_{x2}$ is 32 MHz, $mf_{x2}$ is 5 MHz, and $kf_{x2}$ is 2411 or 2417 MHz, the following is obtained.

$$\{(k+m)n/(n-1)\}f_{x2}=19328/7 \text{ or } 19336/7$$

$$\{(k+m)/(n-1)\}f_{x2}=2416/7 \text{ or } 2422/7$$

Thus, it suffices to determine p with which $2411/32\times p$, $2417/32\times p$, $19328/7/32\times p$, $19336/7/32\times p$, $2416/7/32\times p$, and $2422/7/32\times p$ are all integers. For p=224, the respective values are integers of 16877, 16919, 19328, 19336, 2416, and 2422 and have a least common multiple of one. Accordingly, p needs to be an integer multiple of 224 and has a minimum value of 224.

Figure 11:
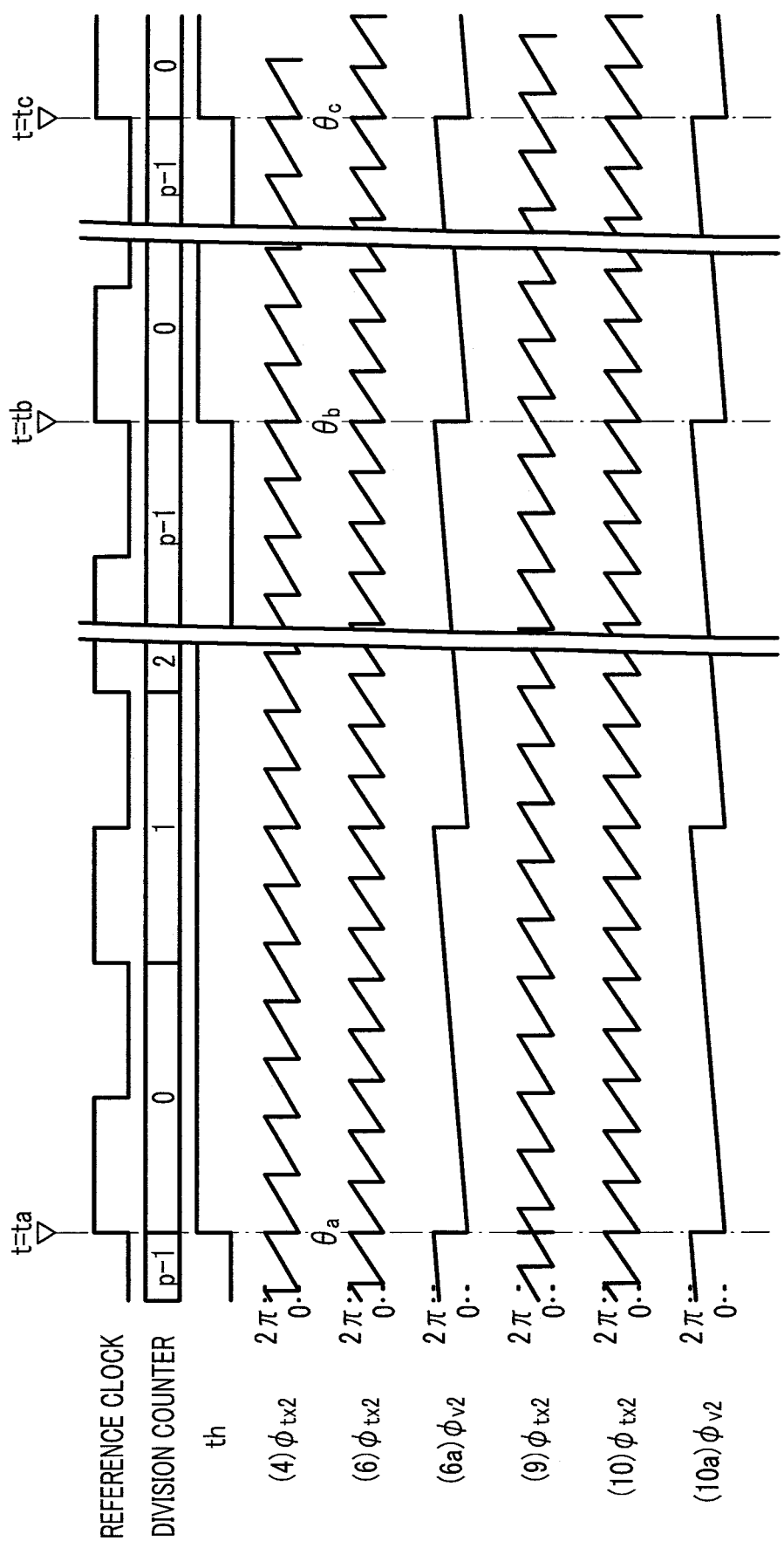
FIG. 11 is a diagram for explaining a relation among a timing signal th and output signals of mpl2A.
Figure 12:
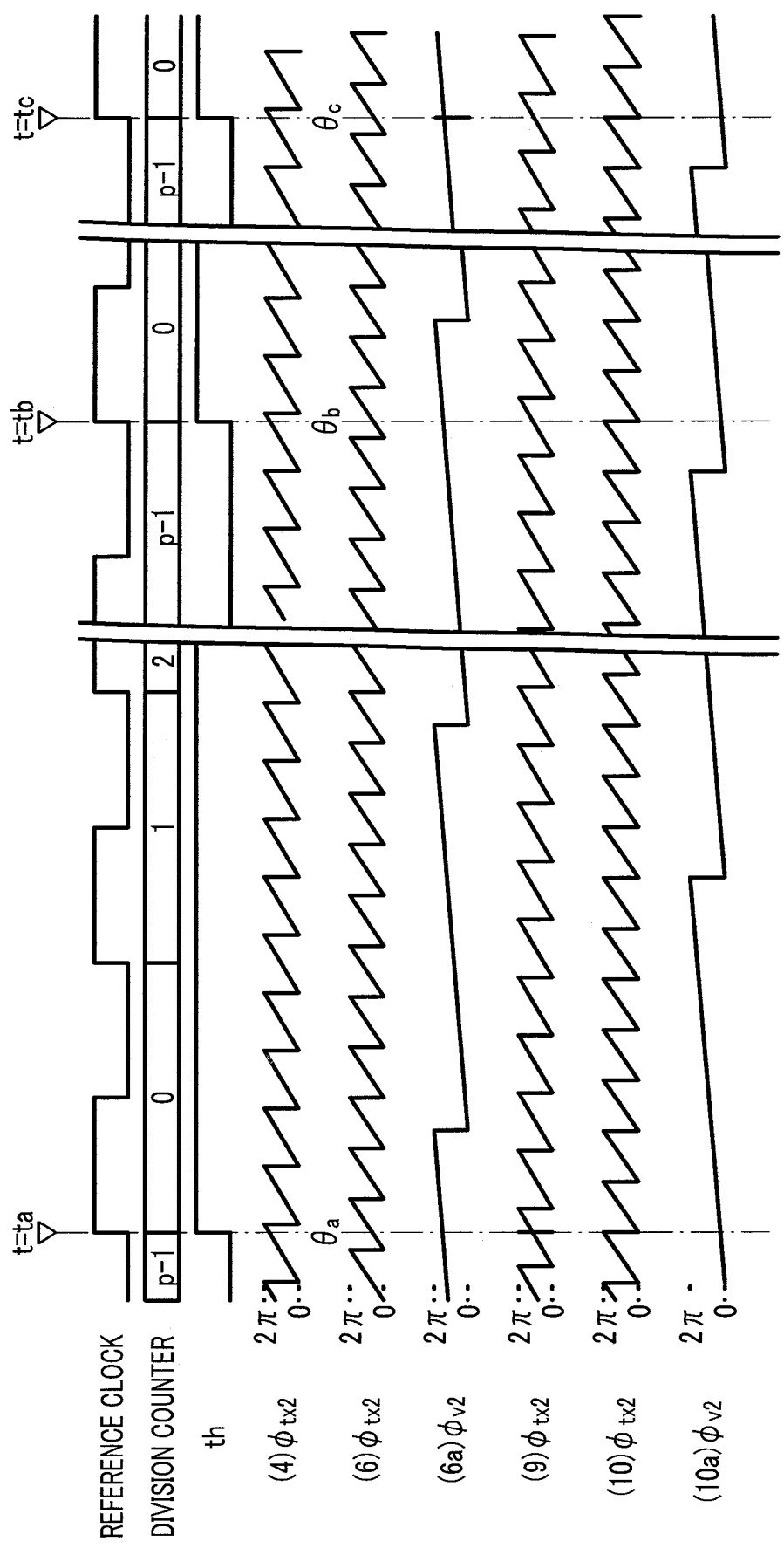
FIG. 12 is another diagram for explaining the relation among the timing signal th and the output signals of mpl2A.

A signal obtained through p frequency division of the reference clock is set as th, and three rising time periods of th are set as $t_a$, $t_b$, and $t_c$, respectively. FIGS. 11 and 12 illustrate examples of the reference clock, th, and phases of signals expressed by equation (4), equation (6), equation (6a), equation (9), equation (10), and equation (10a). A frequency division counter is an example of a counter value when frequency division of the reference clock is performed. The frequency division counter indicates a situation in which a value of 0 to p−1 is counted with the reference clock and th rises each time the value changes from p−1 to 0. FIG. 11 corresponds to an example in which the phases of the signals expressed by equation (4), equation (6), equation (6a), equation (9), equation (10), and equation (10a) are zero at the time $t_a$. Since the period of th is equal to an integral multiple of each of the periods of the signals expressed by equation (4), equation (6), equation (6a), equation (9), equation (10), and equation (10a), the phase of th is zero at any of the times $t_b$ and $t_c$, which is illustrated in FIG. 11.

FIG. 12 illustrates an example in which the phases of the signals expressed by equation (4), equation (6), equation (6a), equation (9), equation (10), and equation (10a) are not zero at the time $t_a$. In this case as well, for example, when phases of the signal expressed by equation (4) are set as $\theta_a$, $\theta_b$, and $\theta_c$, respectively, $\theta_a=\theta_b=\theta_c$ always holds, and this situation is illustrated in FIG. 12. This is same for the other equations. Specifically, it can be intuitively understood from FIG. 12 that a phase of each equation observed at a rising time period of th always has a value same as a value of a phase at another rising time period irrespective of the rising time period. This property can be used for comparison of phases at different times.

The hold circuit 30 holds the output phase of the integrator 15 at the rising time period of the signal th given by the timing generation circuit 40. Thus, an output of the hold circuit 30 is phase information that can be used for comparison of phases at different times. Influence of fluctuation of the reference time phase can be removed by using the output of the hold circuit 30 as described later. In a case of application to a distance measuring device, the output of the hold circuit 30 is supplied to the memory 51, which is a part of the phase calculator phscalc2, as phase information S15 for acquiring first to fourth phases described above.

The timing generation circuit 40 is given the reference clock and generates the predetermined timing signal th to output the timing signal th to the hold circuit 30, with the reference clock as a reference.

Figure 13:
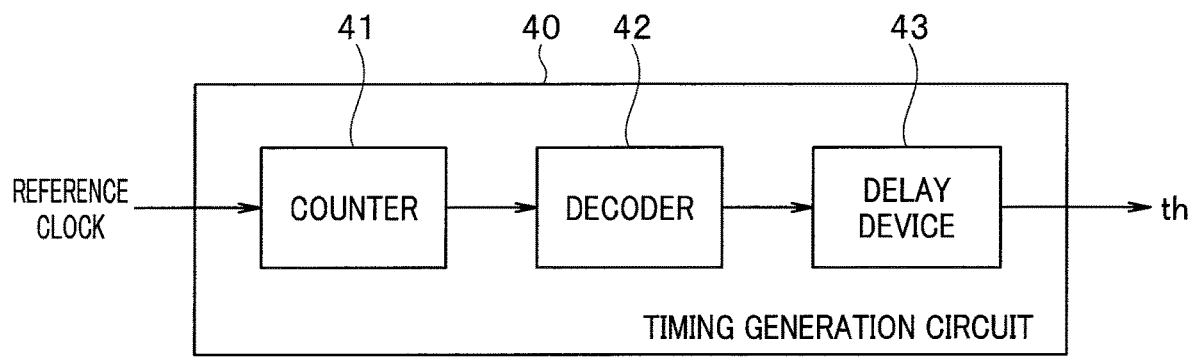
FIG. 13 is a block diagram illustrating one example of a specific configuration of a timing generation circuit 40.

FIG. 13 is a block diagram illustrating one example of a specific configuration of the timing generation circuit 40. The timing generation circuit 40 is configured by a counter 41, a decoder 42, and a delay device 43. The counter 41 counts the reference clock to output a count value to the decoder 42. The decoder 42 generates a timing signal corresponding to the count value by being controlled by the control device CN2 of the operation device CA2 (not illustrated), or based on information stored in a memory not illustrated, and outputs the timing signal to the delay device 43. The delay device 43 generates the timing signal th described above by delaying the inputted timing signal by a predetermined delay time. Note that the timing generation circuit 40 may generate the timing th at a time when an output frequency of the frequency multiplier mpl20 is stable in the reception section and the transmission section.

The phase information stored in the memory 51 is supplied to the calculation circuit 52, and $\theta_{LSUM}$ and $\theta_{HSUM}$ described above are calculated based on control by the control circuit 50. A result of the calculation is outputted from the calculation circuit 52 as phase information S16.

As described later, the calculation circuit 52 can obtain the first to the fourth phase differences described above by performing subtraction between a plurality of pieces of phase information given by the memory 51. For example, it is clear that $\Delta\theta_{LTT2}$ in FIG. 7 can be easily obtained by subtracting a phase acquired in a 2_TX duration for a first time from a phase acquired in a 2_TX duration of a second time.

FIGS. 7 and 8 show that the phase $\phi_{tx2}$ shown by the thick line characteristic C2 and the quasi-reference phase simply increase, but in reality, the phase does not exceed $2\pi$. Thus, the calculation circuit 52 may calculate and output a remainder by $2\pi$ of a result of the subtraction. A distance measurement operation is possible by using the remainder.

Next, an operation of the embodiment that is configured in this way will be described with reference to the graphs in FIGS. 7 and 8. It is assumed that mpl2 operates similarly to mpl2A of the device 2A. In other words, the phase of the output of mpl2 of the device 2, that is, the output phase $\phi_2$ of the integrator 15 is shown by FIG. 7 (characteristic C2) or FIG. 8 (characteristic C2).

It is assumed that an initial setting of mpl20 is performed at the time of the initial setting of the transmission frequency before the time $t_1$. Accordingly, the output phase $\phi_2$ of the integrator 15 indicating a phase $\phi_{tx2}$ of the output of mpl20 is equivalent to a right side of equation (4) described above, and is expressed by a thick line characteristic C2 in FIG. 12. In mpl20, $k_L$ in equation (4) means a rational number indicated by frequency control data $f_a$. An integer value (integer multiplication number) of the rational number corresponds to an integer multiple of 360° ($2\pi$) in phase conversion, and is omitted in a remainder operation for obtaining the phase differences at the calculation circuit 52. Therefore, in calculating the output phase $\phi 2$ of the integrator 15 corresponding to the phase $\theta_{tx2}$ of the output of mpl20, it is not necessary to consider the integer multiplication number, and only a change in the phase by a decimal value (decimal multiplication number) may be calculated. Thus, as described above, the integrator 15 outputs a decimal multiplication number included in the frequency control data $f_a$ to the hold circuit 30. Note that in the following explanation, the right side of equation (4) including a phase amount by the integer multiplication number is directly used, but there is no particular problem.

Further, for explanation, a duration before the time $t_1$ is referred to as a duration T1, a duration between the time $t_1$ and the time $t_2$ is referred to as a duration T12, a duration between the time $t_2$ and the time $t_3$ is referred to as a duration T23, and a duration between the time $t_3$ and the time $t_4$ is referred to as a duration T34. In addition, a phase acquired in the memory 51 of the device 2 is referred to as an acquisition phase at the device 2, and a phase acquired in a memory corresponding to the memory 51 of the device 1 not illustrated is referred to as an acquisition phase at the device 1.

(Calculation of First Phase Difference)

As described above, the phase differences $\Delta\theta_{LTT1}$, $\Delta\theta_{LTT2}$, $\Delta\theta_{HTT1}$, and $\Delta\theta_{HTT2}$ are phase differences between RF signals in two transmission sections sandwiching a reception section in each of the devices 1 and 2, and are referred to as the first phase difference. As it is clear from FIGS. 7 and 8, these phase differences can be obtained from phase differences of the acquisition phase at the device 1 or the acquisition phase at the device 2 in durations described below.

$\Delta\theta_{LTT1}$ is a difference of the acquisition phase at the device 1 between duration 34 and duration 1 at low frequency.

$\Delta\theta_{LTT2}$ is a difference of the acquisition phase at the device 2 between duration 23 and duration 1 at low frequency.

$\Delta\theta_{HTT1}$ is a difference of the acquisition phase at the device 1 between duration 34 and duration 1 at high frequency.

$\Delta\theta_{HTT2}$ is a difference of the acquisition phase at the device 2 between duration 23 and duration 1 at high frequency.

(Calculation of Second Phase Difference)

As described above, the phase differences $\Delta\theta_{LRR2}$ and $\Delta\theta_{HRR2}$ are phase differences between RF signals in two reception sections sandwiching a transmission section, and are referred to as the second phase difference. As it is clear from FIGS. 7 and 8, these phase differences can be obtained from phase differences of the acquisition phase at the device 2 in durations described below.

$\Delta\theta_{LRR2}$ is a difference of the acquisition phase at the device 2 between duration 34 and duration 12 at low frequency.

$\Delta\theta_{HRR2}$ is a difference of the acquisition phase at the device 2 between duration 34 and duration 12 at high frequency.

(Calculation of Third Phase Difference)

As described above, the phase differences $\Delta\theta_{LTR1}$, $\Delta\theta_{LTR2}$, $\Delta\theta_{HTR1}$, and $\Delta\theta_{HTR2}$ are phase differences between RF signals in continuous transmission and reception sections, and are referred to as the third phase difference. As it is clear from FIGS. 7 and 8, these phase differences can be obtained from phase differences of the acquisition phase at the device 1 or the acquisition phase at the device 2 in durations described below.

$\Delta\theta_{LTR1}$ is a difference of the acquisition phase at the device 1 between duration 23 and duration 1 at low frequency.

$\Delta\theta_{LTR2}$ is a difference of the acquisition phase at the device 2 between duration 12 and duration 1 at low frequency.

$\Delta\theta_{HTR1}$ is a difference of the acquisition phase at the device 1 between duration 23 and duration 1 at high frequency.

$\Delta\theta_{HTR2}$ is a difference of the acquisition phase at the device 2 between duration 12 and duration 1 at high frequency.

(Calculation of Fourth Phase Difference)

As described above, $\Delta\theta_{LHx1}$ and $\Delta\theta_{LHx2}$ are phase differences between RF signals in the first transmission section at low frequency and high frequency, and are referred to as the fourth phase difference. As it is clear from explanation so far, these phase differences can be obtained from phase differences of the acquisition phase at the device 1 or the acquisition phase at the device 2 in durations described below.

$\Delta\theta_{LHx1}$ is a difference of the acquisition phase at the device 1 between duration 1 at high frequency and duration 1 at low frequency.

$\Delta\theta_{LHx2}$ is a difference of the acquisition phase at the device 2 between duration 1 at high frequency and duration 1 at low frequency.

In this manner, the first to the fourth phase differences, which are reference time phase differences, can be obtained by the phase calculator phscalc2 illustrated in FIG. 9. The functional unit dcalc2 performs a distance measurement operation by using the obtained first to fourth phase differences.

(Distance Measurement Calculation)

The $\theta_{LSUM}$ in equation (36) described above can be calculated by using the first to the fourth phase differences as shown in equation (42) described above. Likewise, the $\theta_{HSUM}$ in equation (36) described above can also be calculated by using the first to the fourth phase differences as shown in equation (48) described above. In other words, $\theta_{LSUM}$ and $\theta_{HSUM}$ are obtained as values corrected by the fluctuation amount of the reference time phase. The phase calculator phscalc2 outputs $\theta_{LSUM}$ and $\theta_{HSUM}$ that are calculated to the functional unit dcalc2. The functional unit dcalc2 obtains the delay $\tau_R$ by the operation of equation (36) described above from the output of the phase calculator phscalc2 and the signal S9, and further calculates a distance R.

In this way, in the present embodiment, it is possible to achieve the similar function to the function in the case of not changing the reference time phase, by adopting a phase detector configured to acquire and output, at a predetermined timing, an output of a phase integrator included in the all digital phase-locked loop, obtaining a difference between a plurality of phases obtained by an output of the phase detector to obtain the fluctuation amount of the reference time phase, and correcting the phase according to the obtained fluctuation amount.

For example, when the present invention is applied to a distance measuring device that performs transmission and reception of single wave signals between devices and performs distance measurement from a reception phase, and is a distance measuring device using a direct modulation method for a transmission unit and using a sliding IF method for a reception unit, a fluctuation amount of a reference time phase following a frequency change in a distance measurement sequence can be detected and corrected, and therefore accurate distance measurement is possible from phase information.

Note that the present invention is not limited to the above described embodiment, and can be modified variously in the range without departing from the gist of the present invention in the implementation stage, since the gist of the present invention is such that the fluctuation amount of the reference time phase is calculated for each device and phase correction is performed for each device. For example, in the above explanation, the device 1 and the device 2 are explained as receivers of a same configuration with reference to FIG. 1, but the device 1 and the device 2 do not need to have the same configuration, and for example, it can be easily understood that it is possible to apply the present invention to the device 2 and perform distance measurement even when the device 1 is a device configuration as described in Patent Literature 1. Further, the present invention is not limited to a distance measuring device, but is also applicable to various kinds of devices configured to detect a phase of a signal inputted by using a local oscillator. In this case, the operation device CA2 illustrated in, for example, FIG. 9 is also applicable to usage other than distance calculation.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A phase correcting device, comprising:
    a local oscillator that includes an all digital phase-locked loop configured to generate a plurality of kinds of local oscillation signals based on a reference clock using frequency control data indicating a ratio of a desired oscillation output frequency and a frequency of the reference clock, and is configured to give one of the local oscillation signals to a device configured to detect a phase of an inputted signal after the inputted signal subject to phase detection is frequency-converted by using the local oscillation signals and a signal generated from the reference clock;
    a phase detector configured to acquire and output, at a predetermined timing, an output of a phase integrator included in the all digital phase-locked loop; and
    a phase calculator configured to acquire, a plurality of times at the predetermined timing, values outputted from the phase detector acquire a fluctuation amount of an initial phase or a reference time phase that fluctuates due to a change in frequency of the local oscillation signals when the inputted signal is frequency-converted, by using a difference between the values, and correct the phase of the input signal using the acquired fluctuation amount.

2. The phase correcting device according to claim 1, wherein the predetermined timing is all timings or one or more of the all timings of a period equal to common multiples of periods of the plurality of kinds of local oscillation signals.

3. A distance measuring device that calculates a distance based on carrier phase detection, comprising:
    a calculation unit configured to calculate a distance between a first device and a second device based on phase information acquired from the first device and the second device, at least one of which is movable, wherein
    the first device comprises
    a first local oscillator that includes a first all digital phase-locked loop configured to generate a first local oscillation signal based on a first reference clock, and is configured to output the first local oscillation signal,
    a first transmitter configured to transmit two or more first carrier signals by using an output of the first local oscillator by a direct modulation method,
    a first receiver configured to receive two or more second carrier signals by using an output of the first local oscillator,
    a first phase detector configured to acquire and output an output of a phase integrator included in the all digital phase-locked loop at a first predetermined timing, and
    a first phase calculator configured to acquire, a plurality of times at predetermined timings, values outputted from the phase detector and correct a phase of the inputted signal by using a difference between the values,
    the second device comprises
    a second local oscillator that includes a second all digital phase-locked loop configured to generate a second local oscillation signal based on a second reference clock, and is configured to output the second local oscillation signal,
    a second transmitter configured to transmit two or more second carrier signals by using an output of the second local oscillator by a direct modulation method,
    a second receiver configured to receive two or more first carrier signals by using an output of the second local oscillator,
    a second phase detector configured to acquire and output an output of a phase integrator included in the all digital phase-locked loop at a second predetermined timing, and
    a second phase calculator configured to acquire, a plurality of times at predetermined timings, values outputted from the phase detector and correct a phase of the inputted signal by using a difference between the values, and
    the calculation unit calculates the distance based on a phase detection result obtained through reception of the first and second carrier signals by the first and second receivers and the corrected phase obtained by the first and second phase calculators.

4. The distance measuring device according to claim 3, wherein the first and second receivers perform reception by a sliding IF method.

5. The phase correcting device according to claim 1, wherein
    the all digital phase-locked loop comprises: a digitally controlled oscillator configured to output the local oscillation signals; the phase integrator configured to integrate frequency control data at each period of the reference clock, the frequency control data being a ratio of a desired oscillation frequency of the local oscillation signals and a frequency of the reference clock; a phase difference detection circuit configured to obtain a phase difference between each of the local oscillation signals and the reference clock; and a subtractor configured to obtain a difference between an output of the phase integrator and an output of the phase difference detection circuit as a phase error for controlling the digitally controlled oscillator, the phase detector comprises: a timing generation circuit configured to output a signal indicating all timings or one or more of the all timings of a period equal to common multiples of periods of the plurality of kinds of local oscillation signals as a timing signal based on which the first predetermined timing is obtained; and a hold circuit configured to acquire and output the output of the phase integrator by using the timing signal, and the phase calculator comprises: a memory configured to store an output of the hold circuit at a timing at which a phase difference of the inputted signal is to be detected; and a calculation circuit configured to correct the phase of the inputted signal by an operation on a signal stored in the memory.

6. The phase correcting device according to claim 5, wherein the all digital phase-locked loop comprises a frequency divider configured to output signals obtained by frequency dividing the plurality of kinds of local oscillation signals from the digitally controlled oscillator, and the timing generation circuit configured to generate a timing signal for the first predetermined timing based on a period equal to common multiples of the periods of the plurality of kinds of local oscillation signals and all the signals obtained by frequency dividing the plurality of kinds of local oscillation signals.

* * * * *